(12) United States Patent
Taniguchi et al.

(10) Patent No.: US 9,312,443 B2
(45) Date of Patent: Apr. 12, 2016

(54) SEMICONDUCTOR LIGHT DEVICE AND MANUFACTURING METHOD FOR THE SAME

(71) Applicant: FURUKAWA ELECTRIC CO., LTD, Chiyoda-ku, Tokyo (JP)

(72) Inventors: Hidehiro Taniguchi, Tokyo (JP); Yutaka Ohki, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 51 days.

(21) Appl. No.: 14/045,550

(22) Filed: Oct. 3, 2013

(65) Prior Publication Data
US 2014/0027809 A1    Jan. 30, 2014

Related U.S. Application Data

(63) Continuation of application No. PCT/JP2012/001876, filed on Mar. 16, 2012.

(30) Foreign Application Priority Data

Apr. 5, 2011    (JP) .................................. 2011-083556
Apr. 5, 2011    (JP) .................................. 2011-083867

(51) Int. Cl.
*H01L 33/00*    (2010.01)
*H01L 33/30*    (2010.01)
*H01S 5/22*    (2006.01)
(Continued)

(52) U.S. Cl.
CPC ............... *H01L 33/305* (2013.01); *B82Y 20/00* (2013.01); *H01L 33/005* (2013.01); *H01S 5/2072* (2013.01); *H01S 5/22* (2013.01); *H01S 5/028* (2013.01); *H01S 5/0421* (2013.01); *H01S 5/2004* (2013.01); *H01S 5/2068* (2013.01);
(Continued)

(58) Field of Classification Search
CPC ..... H01L 33/30; H01L 33/305; H01L 33/005; H01S 5/2072; H01S 5/22; B82Y 20/00
See application file for complete search history.

(56) References Cited

U.S. PATENT DOCUMENTS

2004/0119081 A1    6/2004   Takemi et al.
2010/0232464 A1*   9/2010   Taniguchi et al. ......... 372/43.01

FOREIGN PATENT DOCUMENTS

JP    2001251010 A    9/2001
JP    2004146527 A    5/2004
(Continued)

OTHER PUBLICATIONS

International Search Report dated Jun. 19, 2012 corresponds to PCT/JP2012/001876.
International Preliminary Report on Patentability mailed Nov. 14, 2013, corresponds to PCT/JP2012/001876.

*Primary Examiner* — Su C Kim
(74) *Attorney, Agent, or Firm* — Hauptman Ham, LLP

(57) ABSTRACT

Provided is a semiconductor light device comprising a semiconductor substrate having a first conduction type; a first cladding layer having the first conduction type deposited above the semiconductor substrate; an active layer; a second cladding layer having a second conduction type; and a contact layer. The active layer includes a window portion that is disordered via diffusion of vacancies and a non-window portion having less disordering than the window portion, and the contact layer includes a first region and a second region that is below the first region and has greater affinity for hydrogen than the first region.

8 Claims, 26 Drawing Sheets

(51) Int. Cl.
*B82Y 20/00* (2011.01)
*H01S 5/028* (2006.01)
*H01S 5/20* (2006.01)
*H01S 5/30* (2006.01)
*H01S 5/343* (2006.01)
*H01S 5/042* (2006.01)

(52) U.S. Cl.
CPC .............. *H01S 5/3054* (2013.01); *H01S 5/343* (2013.01); *H01S 2304/04* (2013.01)

(56) References Cited

FOREIGN PATENT DOCUMENTS

| | | | |
|---|---|---|---|
| JP | 2004207682 A | | 7/2004 |
| JP | 2006-005073 | * | 1/2006 |
| JP | 2007242718 A | | 9/2007 |
| JP | 201114832 A | | 1/2011 |
| WO | 2009/066739 A1 | | 5/2009 |

* cited by examiner

SEMICONDUCTOR LIGHT DEVICE AND MANUFACTURING METHOD FOR THE SAME

The contents of the following patent applications are incorporated herein by reference:

No. 2011-083556 filed in Japan on Apr. 5, 2011,
No. 2011-083867 filed in Japan on Apr. 5, 2011, and
No. PCT/JP2012/001876 filed on Mar. 16, 2012.

BACKGROUND

1. Technical Field

The present invention relates to a semiconductor light device and a manufacturing method thereof.

2. Related Art

In a semiconductor laser element, in order to prevent damage known as COD (Catastrophic Optical Damage) in the end surfaces through which light is input and output, a technique referred to as IFVD (Impurity-Free Vacancy Disordering) is known as a method for forming a window portion with little laser light absorption by increasing the bandgap energy through disordering of the light input and output surfaces, as shown in Patent Document 1, for example.

Patent Document 1: Japanese Patent Application Publication No. 2007-242718

However, with the conventional IFVD technique, it is difficult to keep the degree of disordering in the non-window portion low while maintaining a high degree of disordering in the window portion. Therefore, it is difficult to restrict deterioration of the laser characteristics while preventing COD.

SUMMARY

Therefore, it is an object of an aspect of the innovations herein to provide a semiconductor light device and a manufacturing method thereof, which are capable of overcoming the above drawbacks accompanying the related art. The above and other objects can be achieved by combinations described in the claims. According to a first aspect of the present invention, provided is a semiconductor light device comprising a semiconductor substrate having a first conduction type; a first cladding layer having the first conduction type deposited above the semiconductor substrate; an active layer deposited above the first cladding layer; a second cladding layer having a second conduction type deposited above the active layer; and a contact layer deposited on the second cladding layer. The active layer includes a window portion that is disordered via diffusion of vacancies and a non-window portion having less disordering than the window portion, and the contact layer includes a first region and a second region that is below the first region and has greater affinity for hydrogen than the first region.

According to a second aspect of the present invention, provided is a method of manufacturing a semiconductor light device, comprising forming a semiconductor layer including a first vacancy generating region that generates vacancies and a vacancy diffusion encouraging region that has a greater affinity for hydrogen than the first vacancy generating region and encourages diffusion of the vacancies; depositing two types of dielectric films having different densities on different regions of the semiconductor layer; and through an annealing process, generating vacancies with a density according to a density of the corresponding dielectric film in the first vacancy generating region, dispersing the generated vacancies in the semiconductor layer through the vacancy diffusion encouraging region, forming a first disordered region by disordering a region of the semiconductor layer on which is deposited the dielectric film having a lower density among the two types of dielectric films, and forming a second disordered region having less disordering than the first disordered region on a region of the semiconductor layer on which is deposited the dielectric film having a higher density.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
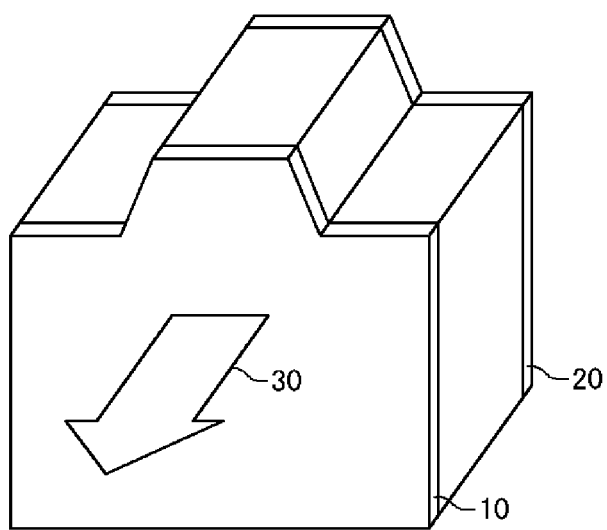
FIG. 1 is a perspective view of a semiconductor laser element according a first embodiment of the present invention.

FIG. 1 is a perspective view of a semiconductor laser element 100 according a first embodiment of the present invention. The present embodiment describes an example in which the semiconductor light device is a semiconductor laser element, but the present invention is not limited to this embodiment. The semiconductor laser element 100 may be a Fabry-Perot resonant cavity laser having a ridge structure that confines the current in a striped pattern in the resonant cavity direction. The semiconductor laser element 100 includes a low reflection coating 10 and a high reflection coating 20 at the end surfaces formed by cleaving a wafer. The high reflection coating 20 amplifies the laser light within the resonant cavity by reflecting the laser light. The low reflection coating 10 has a reflectivity with respect to the laser light that is less than that of the high reflection coating 20, and causes laser light that is resonated in the resonant cavity to be output to the outside as the emitted light 30.

Figure 2:
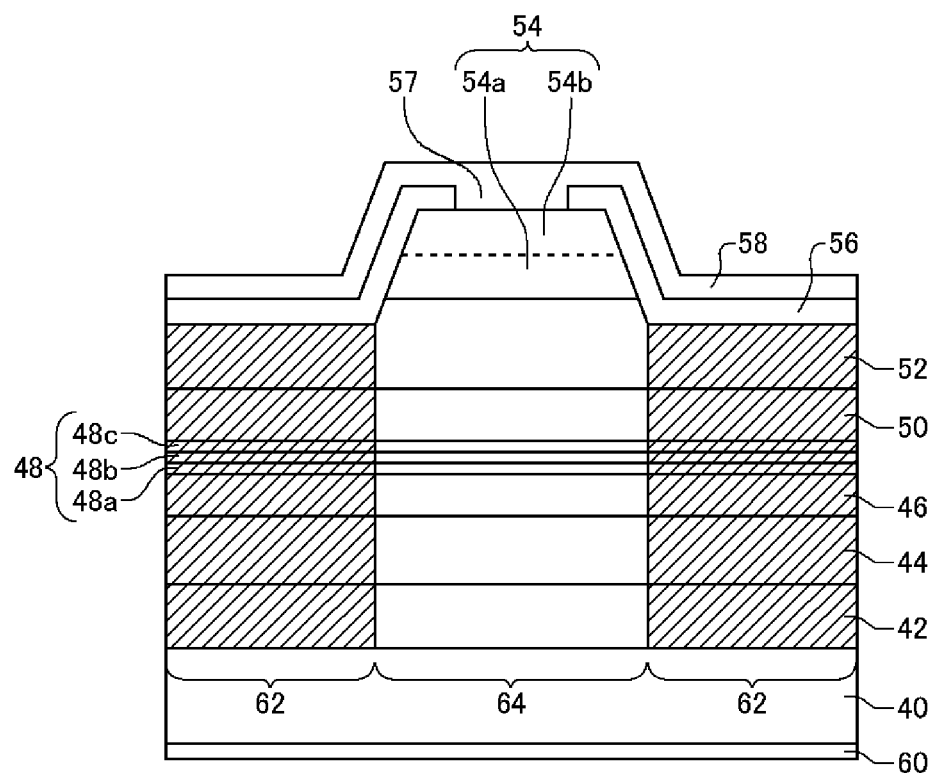
FIG. 2 is a cross-sectional view of the semiconductor laser element shown in FIG. 1.

FIG. 2 is a cross-sectional view of the semiconductor laser element 100. The semiconductor laser element 100 includes a semiconductor substrate 40 having a first conduction type, a buffer layer 42 having the first conduction type, a first cladding layer 44 having the first conduction type, a first guide layer 46 having the first conduction type, an active layer 48, a second guide layer 50 having a second conduction type, a second cladding layer 52 having the second conduction type, a contact layer 54 deposited on the second cladding layer 52, an insulating layer 56, an upper electrode 58, and a lower electrode 60.

The present embodiment describes an example in which the first conduction type is n-type and the second conduction type is p-type, but instead the first conduction type may be p-type and the second conduction type may be n-type. The semiconductor substrate 40 having the first conduction type may be an n-type GaAs substrate. The n-type buffer layer 42, the n-type first cladding layer 44, the n-type first guide layer 46, the active layer 48, the p-type second guide layer 50, the p-type second cladding layer 52, the p-type contact layer 54, and the insulating layer 56 are sequentially deposited on the surface of the semiconductor substrate 40.

The upper electrode 58 is formed to cover the insulating layer 56. The insulating layer 56 includes an opening 57 in the top portion of the contact layer 54. The contact layer 54 is in ohmic contact with the upper electrode 58 through the opening 57. The lower electrode 60 is formed on the bottom surface of the semiconductor substrate 40.

The semiconductor laser element 100 has a ridge structure in the shape of stripes machined into a mesa shape in which the widths of the top layer of the p-type second cladding layer 52 and the contact layer 54 decrease as distance from the semiconductor substrate 40 increases. Due to this ridge structure, the semiconductor laser element 100 confines the current injected into the active layer 48.

The n-type buffer layer 42 functions as a buffer layer for depositing an epitaxial layer with good crystallinity on the semiconductor substrate 40. The buffer layer 42 has a lattice constant between the lattice constants of the semiconductor substrate 40 and the first cladding layer 44. The n-type buffer layer 42 may be an n-type GaAs layer.

The n-type first cladding layer 44 and the n-type first guide layer 46 have their refractive indexes and thicknesses adjusted in a manner to confine light in the layering direction. The refractive index of the first cladding layer 44 is less than the refractive index of the first guide layer 46. The n-type first cladding layer 44 and the n-type first guide layer 46 may include n-type AlGaAs layers. In this case, by setting the Al composition of the n-type first cladding layer 44 to be greater than the Al composition of the n-type first guide layer 46, the refractive index of the n-type first cladding layer 44 can be made less than the refractive index of the n-type first guide layer 46. The thickness of the n-type first guide layer 46 may be approximately 400 μm, and the thickness of the n-type first cladding layer 44 may be approximately 3 μm.

The active layer 48 may include a lower barrier layer 48a, a quantum well layer 48b, and an upper barrier layer 48c. The lower barrier layer 48a and the upper barrier layer 48c confine carriers in the quantum well layer 48b. The lower barrier layer 48a and the upper barrier layer 48c may include AlGaAs layers that are not doped with impurities. The quantum well layer 48b may include an InGaAs layer that is not doped with impurities. The recombination energy of the carriers confined in the potential well structure is determined according to the In composition and thickness of the quantum well layer 48b. The active layer 48 is not limited to having a single quantum well (SQW) structure, and may instead have a multiple quantum well (MQW) structure.

The p-type second guide layer 50 and the p-type second cladding layer 52 form a pair with the n-type first guide layer 46 and the n-type first cladding layer 44 described above, and have refractive indexes and thicknesses that are adjusted in a manner to confine light in the layering direction. The p-type second guide layer 50 and the p-type second cladding layer 52 may include p-type AlGaAs layers. For example, by setting the Al composition of the p-type second cladding layer 52 to be greater than the Al composition of the p-type second guide layer 50, the refractive index of the p-type second cladding layer 52 can be made less than the refractive index of the p-type second guide layer 50. The thickness of the p-type second guide layer 50 may be approximately 400 μm, and the thickness of the p-type second cladding layer 52 may be approximately 1 μm to 2 μm.

The contact layer 54 includes a first region 54b and a second region 54a. The first region 54b functions as a first vacancy generating region that generates vacancies when the window portion 62 is formed, as described in detail further below. Specifically, the first region 54b is a semiconductor layer having the second conduction type and doped with a first p-type dopant. The first region 54b may be a p-type GaAs layer. Here, the first p-type dopant may be zinc (Zn), magnesium (Mg), or beryllium (Be). In order for the first region 54b to realize reliable ohmic contact with the upper electrode 58, the first region 54b may be doped with a high concentration of Zn, e.g. approximately 1E+19 (atoms/cm$^3$).

The second region 54a functions as a vacancy diffusion encouraging region that encourages diffusion of vacancies when the window portion 62 is formed. The second region 54a has a greater affinity for hydrogen than the first region 54b. The second region 54a may be formed with a growth temperature lower than that of the first region 54b. The greater affinity for hydrogen in the second region 54a may be realized by setting a higher growth rate, increasing the amount of defects caused by damage, increasing the flow rate of a hydrogen compound during growth, or increasing the hydrogen atmosphere when growth is stopped, for example, for the second region 54a with respect to the first region 54b.

The second region 54a may be formed as a thin region at an interface between semiconductor layers. The second region 54a may be a semiconductor layer having the second conduction type and doped with a second p-type dopant. The second region 54a may be a p-type GaAs layer. The second p-type dopant has greater affinity for hydrogen than the first p-type dopant. The second p-type dopant may be carbon (C). The second region 54a is below the first region 54b.

The total doping amount in the contact layer 54 is preferably no greater than 1.0E+15 (atoms/cm$^2$). Here, the doping amount is an amount defined as the doping concentration (atoms/cm$^3$) multiplied by the layer thickness (cm). The doping amount of the second region 54a may be less than the doping amount of the first region 54b.

The semiconductor laser element 100 includes the window portion 62 and the non-window portion 64. The non-window portion 64 in formed in the layers from the second cladding layer 52 to the buffer layer 42, in a region below the contact layer 54. The window portion 62 is formed in a region surrounding the non-window portion 64. The window portion 62 has higher bandgap energy than the non-window portion 64, and is less likely to absorb laser light than the non-window portion 64. The window portion 62 includes a disordered portion formed by dispersing group III vacancies generated by the first region 54b.

The active layer 48 includes the window portion 62 disordered by the diffusion of the vacancies and the non-window portion 64 having a lower degree of disordering than the window portion 62. The disordering of the window portion 62 may be at least five times that of the non-window portion 64. Specifically, the disordering of the window portion 62 is no less than 25 meV, and the disordering of the non-window portion 64 is no greater than 5 meV. With the semiconductor laser element 100, since the disordering of the window portion 62 is less than the disordering of the non-window portion 64, the deterioration of the laser characteristics can be decreased while preventing the occurrence of COD.

The following describes an embodiment of a method for manufacturing the semiconductor light device according to the present invention. Here, an example is described in which the semiconductor laser element 100 is used as the semiconductor light device, but the semiconductor light device is not limited to this. The semiconductor light device manufacturing method includes a step of forming a semiconductor layer, a step of depositing two types of dielectric films (first film 70 and second film 72) with different densities on different regions of the semiconductor layer, and a step of forming a first disordered region and a second disordered region on the semiconductor layer via an annealing process. The semiconductor layer includes a first vacancy generating region that generates vacancies and a vacancy diffusion encouraging region that encourages diffusion of the vacancies. The vacancy diffusion encouraging region has a greater affinity for hydrogen than the first vacancy generating region. The annealing process causes the first vacancy generating region to generate vacancies. The first vacancy generating region generates vacancies with a density according to the density of the corresponding dielectric film. The generated vacancies are dispersed in the semiconductor layer through the vacancy diffusion encouraging region. Among the two types of dielectric films (first film 70 and second film 72), the first disordered region is formed by disordering the region of the semiconductor layer on which is deposited the dielectric film with the lower density (first film 70). The second disordered region having a lower disordering than the first disordered region is formed in the region of the semiconductor layer on which is deposited the dielectric film having higher density (second film 72). In the present embodiment, the first disordered region includes the window portion 62 and the second disordered region includes the non-window portion 64.

Figure 3:
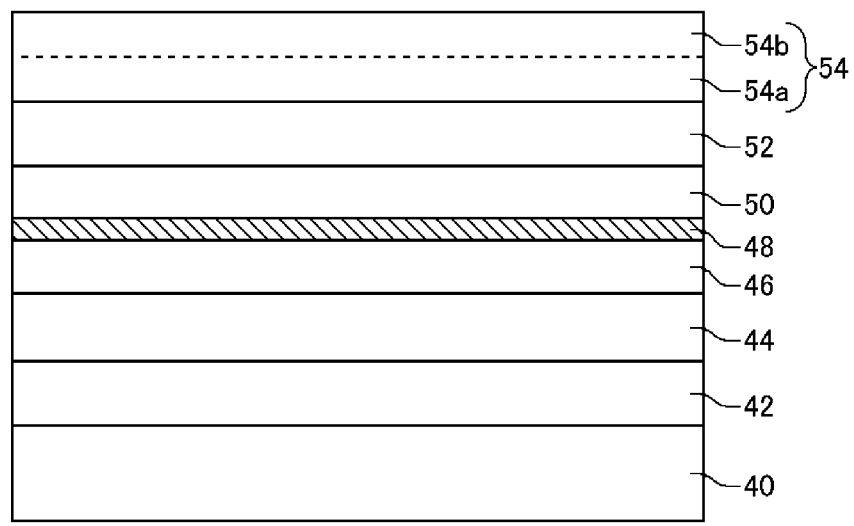
FIG. 3 shows a step for describing the method for manufacturing the semiconductor laser element according to the first embodiment.

FIGS. 3 to 8 show steps describing the method for manufacturing the semiconductor laser element 100 according to the first embodiment. As shown in FIG. 3, the step of forming the semiconductor layer includes a step of preparing the semiconductor substrate 40 having the first conduction type, a step of sequentially depositing, on the semiconductor substrate 40 having the first conduction type, a plurality of semiconductor layers including the n-type buffer layer 42, the n-type first cladding layer 44, the n-type first guide layer 46, the active layer 48, the p-type second guide layer 50, and the p-type second cladding layer 52, and a step of depositing a contact layer 54 on the p-type second cladding layer 52. Each layer is sequentially deposited by using an epitaxial growth technique such as metal organic chemical vapor deposition (MOCVD) or molecular beam epitaxy (MBE).

The step of depositing the contact layer 54 includes a step of forming the vacancy diffusion encouraging region that encourages diffusion of the vacancies and a step of forming the first vacancy generating region that generates vacancies. In the present embodiment, the vacancy diffusion encouraging region is the second region 54a and the first vacancy generating region is the first region 54b. The step of forming the second region 54a may include a step of deposition using epitaxial growth at a first temperature. The step of forming the first region 54b may include a step of deposition using epitaxial growth at a second temperature that is higher than the first temperature.

The step of depositing the first region 54b using epitaxial growth at the second temperature includes a step of doping with the first p-type dopant. The step of depositing the second region 54a using epitaxial growth at the first temperature includes a step of doping with the second p-type dopant. The step of deposition using epitaxial growth at the first temperature may be performed at a temperature that decreases the doping efficiency of the second p-type dopant relative to the increase in the growth temperature. Here, the doping efficiency refers to the ratio of the doping concentration to the concentration of the activated dopant. In other words, the depositing of the second region 54a using epitaxial growth is performed in a temperature range that reduces the doping concentration of the dopant introduced in the film relative to the increase in the growth temperature.

Specifically, the first temperature is a temperature lower than 680° C., e.g. a temperature of approximately 620° C. The second temperature is a temperature of 680° C. or more, e.g. a temperature of approximately 700° C. The present embodiment describes an example in which Zn is used as the first p-type dopant and C is used as the second p-type dopant.

The step of depositing the contact layer 54 may be performed through a single epitaxial growth step. In other words, the second region 54a is deposited by performing epitaxial growth with C as the dopant at the first temperature, and then the first region 54b is deposited by performing epitaxial growth with Zn as the dopant at the second temperature.

The second region 54a contains the dopant C, which has a high affinity for hydrogen (H), and is formed using epitaxial growth at the first temperature, and therefore the H is easily introduced in the film. In other words, the second region 54a has a higher hydrogen concentration than the first region 54b. However, the surface of the second region 54a formed by epitaxial growth at the first temperature with a high concentration of the C dopant has worsened crystallinity. Therefore, by performing epitaxial growth with a high concentration of Zn at the second temperature, the crystallinity is improved and the contact resistance with the upper electrode 58 can be reduced.

The step of forming the second region 54a may include a step of epitaxial growth at a first growth rate. The step of forming the first region 54b may include a step of epitaxial growth at a second growth rate that is lower than the first growth rate. The first growth rate may be approximately 0.34 nm/s or more. As described further below, a high concentration of H can be introduced in the film by increasing the growth rate of the film of the second region 54a, and it is therefore preferable to do so.

Figure 4:
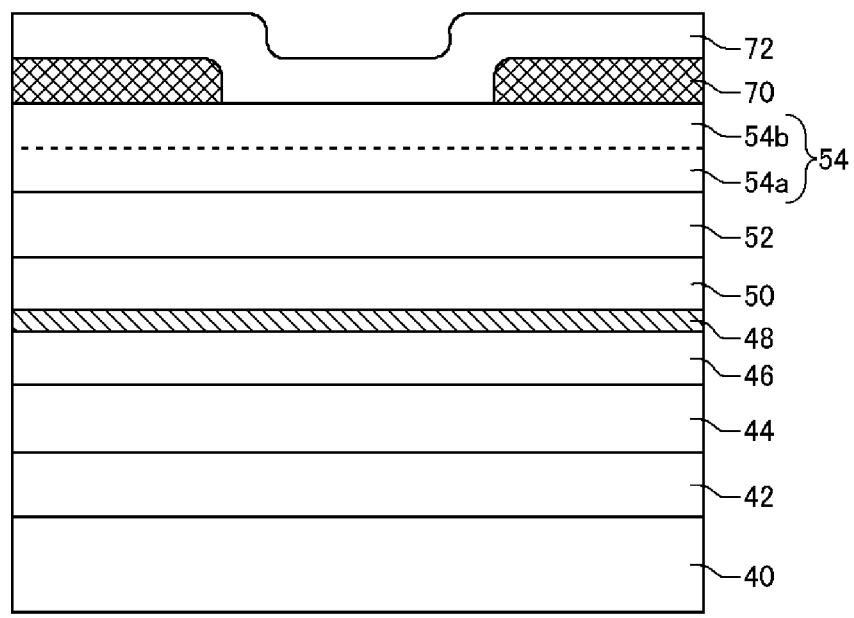
FIG. 4 shows a step performed after the step shown in FIG. 3.

FIG. 4 shows a step following the step shown in FIG. 3. As shown in FIG. 4, the step of depositing the two types of dielectric films with different densities includes a step of depositing the two types of dielectric films (first film 70 and second film 72) with different densities on different regions of the contact layer 54. First, an SiN film of 100 nm, for example, is deposited on the contact layer 54 using catalytic CVD, with silane gas and ammonia gas as the raw material. The SiN film is deposited in a state where the flow rate of the raw materials silane and ammonia is ammonia-rich. After this, a photolithography step and an etching step are performed to remove the SiN film outside of the region of the contact layer 54 corresponding to the window portion 62, thereby forming the first film 70 on the region of the contact layer 54 corresponding to the window portion 62. Since the first film 70 is deposited with N-rich conditions, the first film 70 is a non-dense film. The film density of the first film 70 is approximately 2.69 g/cm$^3$, for example.

Next, a SiN film of 30 nm, for example, formed with Si-rich conditions on the first film 70 and the contact layer 54 is deposited using catalytic CVD. The second film 72 is deposited with Si-rich conditions, and therefore is a dense film. The film density of the second film 72 is 2.79 g/cm$^3$, for example. In other words, the second film 72, which is a dense film having higher density than the first film 70, is formed on the region corresponding to the non-window portion 64. A film made of a material other than SiN may be used as the dielectric film.

Figure 5:
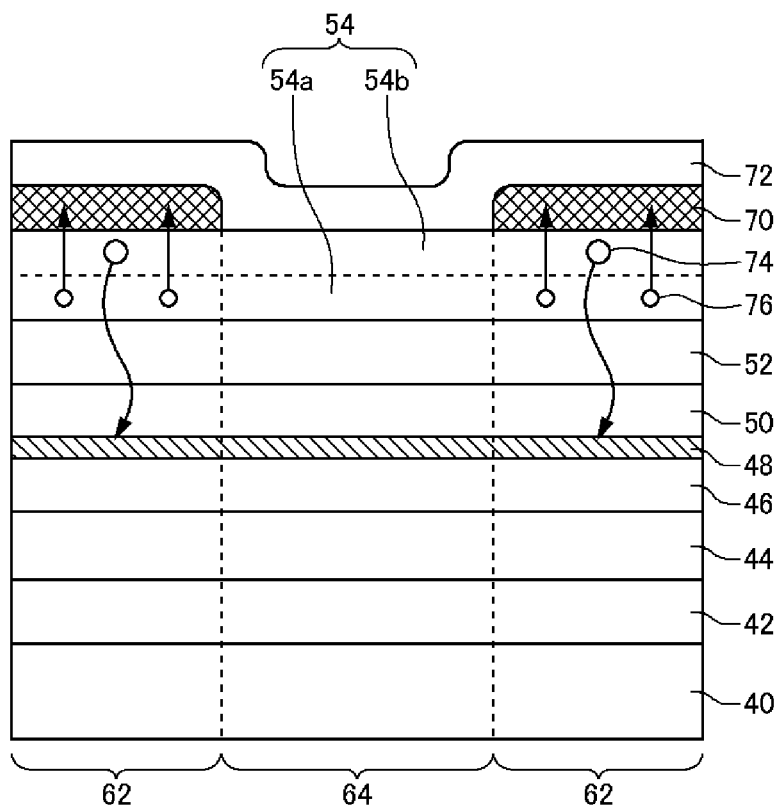
FIG. 5 shows a step of forming the window portion and the non-window portion shown in FIG. 1.

FIG. 5 shows a step following the step shown in FIG. 4. The step of forming the window portion 62 and the non-window portion 64 through the annealing process includes a step of making the hydrogen concentration of the region of the second region 54a corresponding to the non-window portion 64 greater than the hydrogen concentration of the region corresponding to the window portion 62. The annealing process is a rapid thermal annealing (RTA) process performed at 915° C. for 30 seconds, for example.

As described above, the hydrogen concentration of the second region 54a is higher than that of the first region 54b. When heated through the RTA process, the hydrogen 76 in the second region 54a is absorbed in the first film 70. As a result, the portion of the second region 54a corresponding to the window portion 62 has a lower hydrogen concentration. On the other hand, the hydrogen of the portion of the second region 54a corresponding to the non-window portion 64 is not easily absorbed by the second film 72, which is a dense film. In other words, as a result of the annealing process, in the second region 54a, the hydrogen concentration of the region corresponding to the non-window portion 64 is higher than the hydrogen concentration of the region corresponding to the window portion 62.

Internal vacancies caused by the separation of the hydrogen 76 are generated in the second region 54a corresponding to the window portion 62. Here, the internal vacancies refer to vacancies that are generated by the absorption of the hydrogen 76 in the first film 70.

The Ga in the first region 54b corresponding to the window portion 62 is absorbed in the first film 70 as a result of the RTA process, and group III vacancies 74 are generated with a density depending on the density of the first film 70. In other words, the second region 54a generates internal vacancies that are separate from the group III vacancies 74. The group III vacancies 74 are dispersed from the surface side of the first region 54b toward the second region 54a.

The second region 54a receives the group III vacancies 74 generated by the first region 54b. in the second region 54a corresponding to the window portion 62, the group III vacancies 74 join together the internal vacancies, such that the group III vacancy concentration increases suddenly. The group III vacancies 74 and the internal vacancies are dispersed all at once from the second region 54a in a direction of the active layer 48. In other words, diffusion of the group III vacancies 74 is encouraged by the presence of the internal vacancies.

On the other hand, the H in the second region 54a corresponding to the non-window portion 64 is barely absorbed in the second film 72, which is a dense film, and there are fewer internal vacancies in this region than in the second region 54a corresponding to the window portion 62. The Ga in the first region 54b corresponding to the non-window portion 64 is barely absorbed by the second film 72, which is a dense film. Therefore, there are fewer group III vacancies 74 in the first region 54b corresponding to the non-window portion 64 than in the region corresponding to the window portion 62. Accordingly, the active layer 48 corresponding to the non-window portion 64 has a much lower disordering than the active layer 48 corresponding to the window portion 62.

Figure 6:
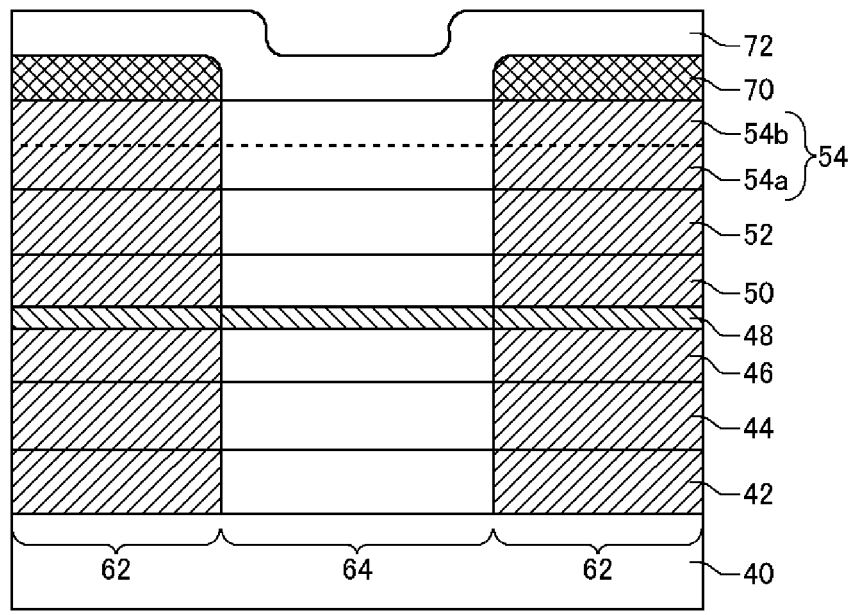
FIG. 6 shows the window portion and the non-window portion formed by the step shown in FIG. 5.

FIG. 6 shows the window portion 62 and the non-window portion 64 formed by the step shown in FIG. 5. As a result of the step shown in FIG. 5, the window portion 62 is formed by disordering the active layer 48 corresponding to the region where the dielectric film having the lower density, from among the two types of dielectric films, is deposited and the non-window portion 64, which has a lower disordering than the window portion 62, is formed in the active layer 48 corresponding to the region where the dielectric film having the higher density is deposited. As a result, the absorption of laser light at the window portion 62 of the active layer 48 is restricted to prevent the occurrence of COD, and deterioration of the laser characteristics in the non-window portion 64 is prevented.

Figure 7:
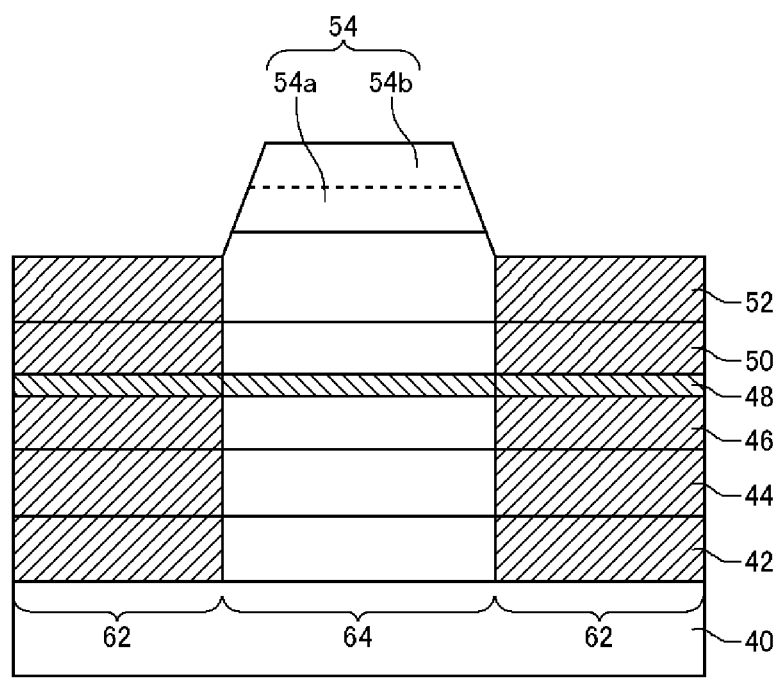
FIG. 7 shows a step performed after the step shown in FIGS. 5 and 6.

FIG. 7 shows a step following the steps shown in FIGS. 5 and 6. As shown in FIG. 7, the semiconductor laser element 100 manufacturing method includes a step of forming a ridge structure. After the window portion 62 and the non-window portion 64 are formed, the first film 70 and the second film 72 are removed. After this, a photolithography step and an etching step are performed to remove the upper portion of the contact layer 54 and the p-type second cladding layer 52 in a striped pattern to form the ridge structure.

Figure 8:
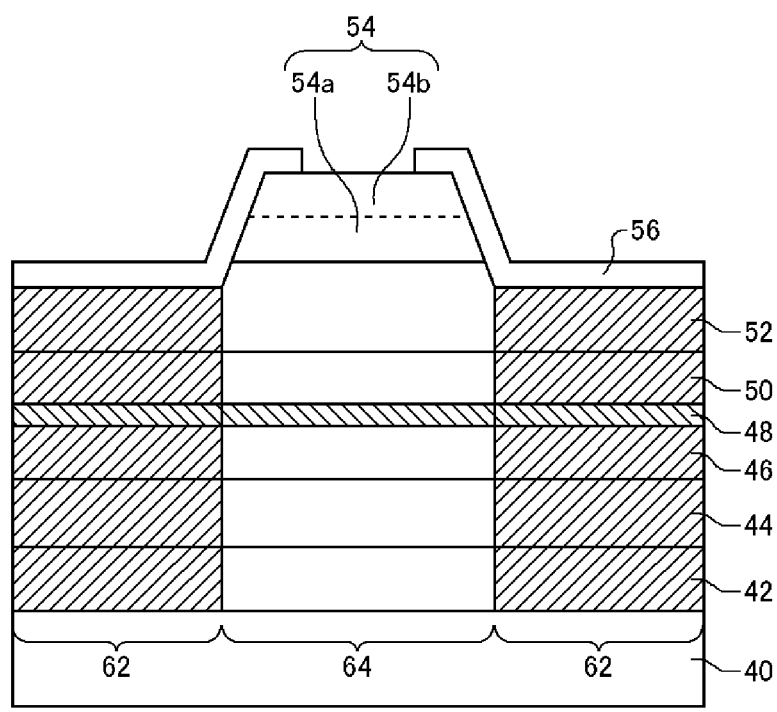
FIG. 8 shows a step performed after the step shown in FIG. 7.

FIG. 8 shows a step following the step shown in FIG. 7. As shown in FIG. 8, the semiconductor laser element 100 manufacturing method includes a step of depositing an insulating film on the contact layer 54 and the second cladding layer 52 and a step of forming electrodes. The insulating film is a silicon oxide film or a silicon nitride film deposited using CVD, for example. The step of forming the electrodes includes a step of forming an opening 57 in the region contacting the upper electrode 58 via a photolithography step and an etching step, and a step of forming the upper electrode 58 over the entire top surface of the semiconductor substrate 40 and vapor-depositing the lower electrode 60 over the entire bottom surface of the semiconductor substrate 40, through a sputtering step. Finally, the semiconductor substrate 40 is cleaved to form the low reflection coating 10 and the high reflection coating 20 on the cleaved surfaces, thereby completing the semiconductor laser element 100.

Figure 9:
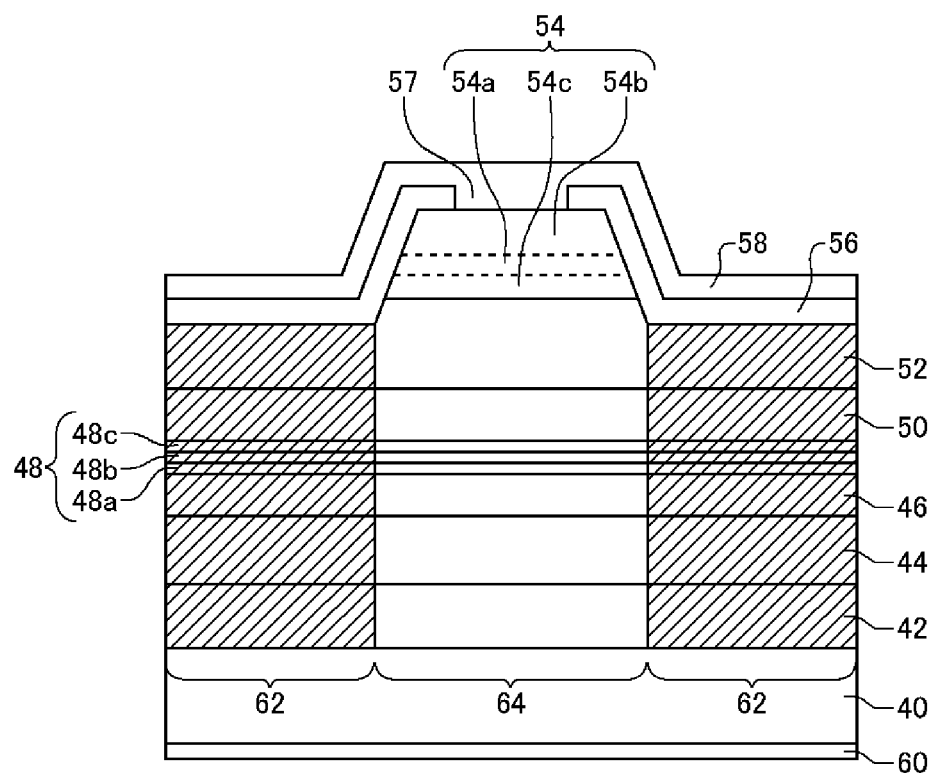
FIG. 9 is a cross-sectional view of a modification of the semiconductor laser element shown in FIG. 1.

FIG. 9 shows a semiconductor laser element 110 according to a modification of the semiconductor laser element 100. The semiconductor laser element 110 differs from the semiconductor laser element 100 with respect to the configuration of the contact layer 54. In comparison to the contact layer 54 shown in FIG. 2, the first contact layer 54 of the semiconductor laser element 110 further includes a third region 54c. The third region functions as a second vacancy generating region. The third region 54c has a p-type doping amount lower than that of the first region 54b. The second region 54a is provided between the first region 54b and the third region 54c.

The step of depositing the contact layer 54 includes a step of depositing the third region 54c through epitaxial growth at a second temperature, prior to the step of depositing the second region 54a through epitaxial growth at the first temperature. The Zn doping amount of the first region 54b may be 1E+19 (atoms/cm$^3$), and the Zn doping amount of the third region 54c may be 1E+18 (atoms/cm$^3$). The first region 54b, the second region 54a, and the third region 54c are formed by a single epitaxial growth step.

Figure 10:
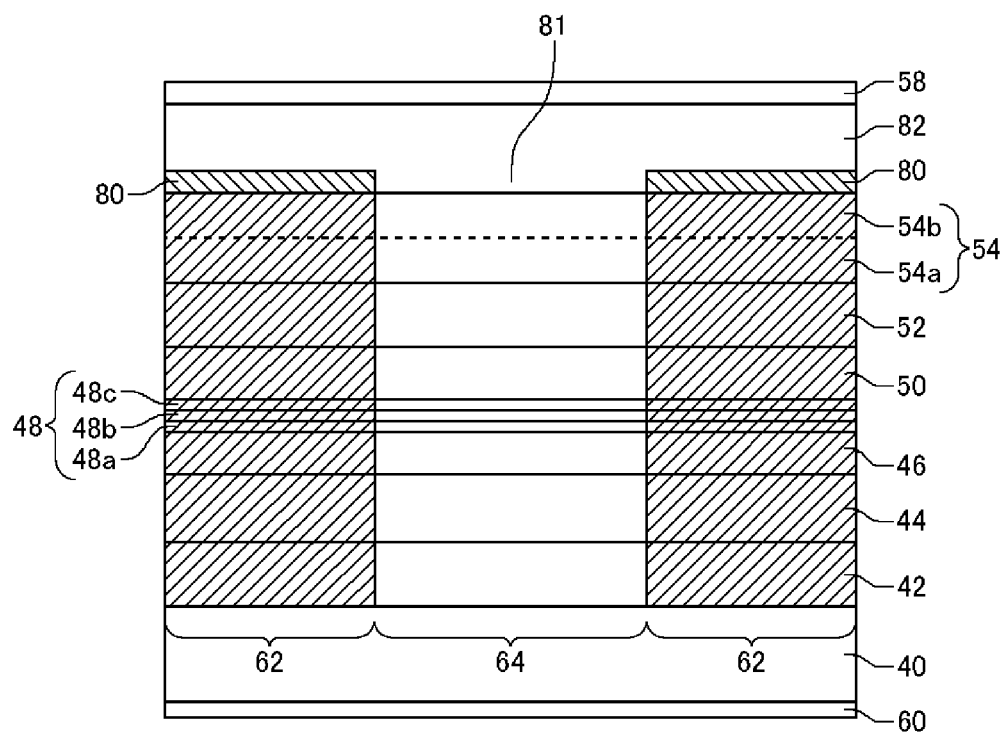
FIG. 10 is a cross-sectional view of the semiconductor laser element manufactured according to the manufacturing method of the second embodiment.

FIG. 10 is a cross-sectional view of a semiconductor laser element 200 manufactured according to a manufacturing method of a second embodiment of the present invention. Instead of having a ridge structure, the semiconductor laser element 200 differs from the semiconductor laser element 100 of the first embodiment by including a current confinement layer 80. The semiconductor laser element 200 includes a semiconductor substrate 40 having a first conduction type, a buffer layer 42 having the first conduction type, first cladding layer 44 having the first conduction type, a first guide layer 46 having the first conduction type, an active layer 48, a second guide layer 50 having a second conduction type, a second cladding layer 52 having the second conduction type, a contact layer 54 deposited on the second cladding layer 52, a current confinement layer 80, a second contact layer 82, an upper electrode 58, and a lower electrode 60.

In FIG. 10, components that have the same reference numerals as components in FIG. 2 may have the same function and configuration as these components as described in relation to FIGS. 2 to 9. In the semiconductor laser element 200, the structure form the lower electrode 60 to the second cladding layer 52 may be the same as the structure of the semiconductor laser element 100 from the lower electrode 60 to the second cladding layer 52.

The first contact layer 54 includes a second region 54a formed through low-temperature epitaxial growth and doped with a high concentration of C, and a first region 54b formed through high-temperature epitaxial growth and doped with a high concentration of Zn, Mg, or Be. In the second region 54a, the hydrogen concentration of the region corresponding to the non-window portion 64 is higher than the hydrogen concentration of the region corresponding to the window portion 62.

The current confinement layer 80 is formed on the first contact layer 54, and includes an opening 81 corresponding to the non-window portion 64. The current confinement layer 80 may be an n-type GaAs layer. The second contact layer 82 is deposited on the current confinement layer 80 and the first contact layer 54 exposed by the opening 81. The second contact layer 82 includes a p-type GaAs layer doped with a high concentration of Zn or Mg. The second contact layer 82 is in ohmic contact with the upper electrode 58. The current confinement layer 80 confines the current injected from the upper electrode 58, and improves the carrier density in the quantum well layer 48b.

In the semiconductor laser element 200, the window portion 62 is formed in the region corresponding to the current confinement layer 80, and the non-window portion 64 is formed in the region corresponding to the opening 81. In the semiconductor laser element 200, the effect of the internal vacancies in the second region 54a increases the disordering of the window portion 62 in the quantum well layer 48b of the active layer 48 and decreases the disordering in the non-window portion 64. Accordingly, deterioration of the laser characteristics can be restricted while preventing the occurrence of COD.

FIGS. 11 to 15 show steps describing the manufacturing method of the semiconductor laser element 200 according to the second embodiment of the present invention. In the same manner as the semiconductor device manufacturing method described above, the semiconductor laser element 200 manufacturing method includes a step of forming a semiconductor layer, a step of depositing two types of dielectric films (first film 70 and second film 72) with different densities on different regions of the semiconductor layer, and a step of forming a window portion 62 and a non-window portion 64 on the semiconductor layer via an annealing process. The step of forming the semiconductor layer includes a step of preparing a semiconductor substrate 40, a step of sequentially depositing, on the semiconductor substrate 40, a plurality of semiconductor layers including the n-type buffer layer 42, the n-type first cladding layer 44, the n-type first guide layer 46, the active layer 48, the p-type second guide layer 50, and the p-type second cladding layer 52, and a step of depositing the first contact layer 54 on the p-type second cladding layer 52. Each layer is formed by epitaxial growth using MOCVD or MBE. The step of depositing the first contact layer 54 is the same as the step of depositing the contact layer 54 shown in FIG. 3, and therefore redundant description is omitted.

After deposition of the first contact layer 54, an n-type GaAs layer that will become the current confinement layer 80 is deposited on the first contact layer 54. On top of this layer, a SiO$_2$ film 84 is formed using CVD, for example. Next, the SiO$_2$ film 84 in the region corresponding to the opening 81 is removed by a photolithography step and an etching step.

Figure 11:
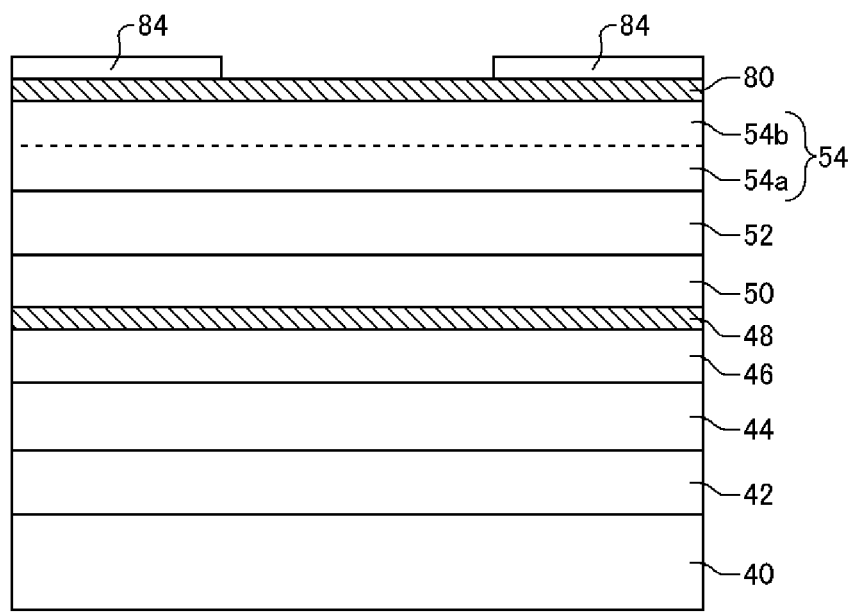
FIG. 11 shows a step for describing the method for manufacturing the semiconductor laser element according to the second embodiment.
Figure 12:
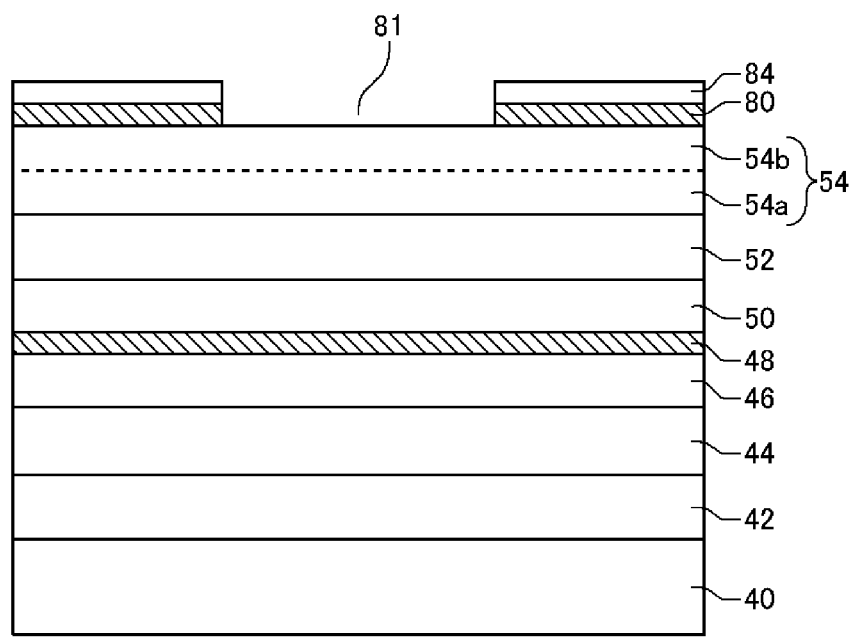
FIG. 12 shows a step performed after the step shown in FIG. 11.

FIG. 12 shows a step following the step shown in FIG. 11. As shown in FIG. 12, the etching step is performed with the SiO$_2$ film 84 as the etching mask, thereby forming the current confinement layer 80. Next, the SiO$_2$ film 84 serving as the etching mask is removed. An insulating film other than the SiO$_2$ film 84 may be used as the etching mask.

Figure 13:
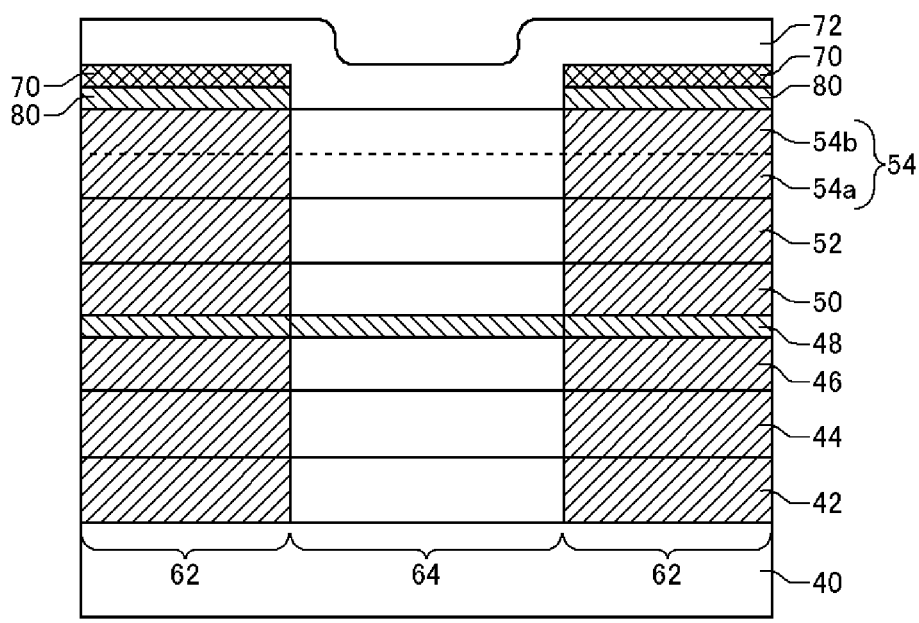
FIG. 13 shows a step performed after the step shown in FIG. 12.

FIG. 13 shows a step following the step shown in FIG. 12. The step of depositing the two types of dielectric films (70 and 72) with different densities includes a step of depositing the first film 70, which is a non-dense film, in the region corresponding to the window portion 62 and depositing the second film 72, which is a dense film, in the region corresponding to non-window portion 64. This step is the same as the step shown in FIG. 4, and therefore a redundant description is omitted. The step of forming the window portion 62 and the non-window portion 64 on the semiconductor layer through an annealing process includes a step of making the hydrogen concentration of the region corresponding to the non-window portion 64 of the second region 54a, which is the vacancy diffusion encouraging region, higher than the hydrogen concentration of the region corresponding to the window portion 62. As a result of the RTA process, the internal vacancies generated by the second region 54a corresponding to the window portion 62 encourage diffusion of the group III vacancies generated by the first region 54b corresponding to the window portion 62 and cause disordering of the active layer 48 corresponding to the window portion 62. The active layer 48 corresponding to the non-window portion 64 is not disordered. This step is the same as the step described in FIGS. 5 and 6, and therefore a redundant description is omitted.

Figure 14:
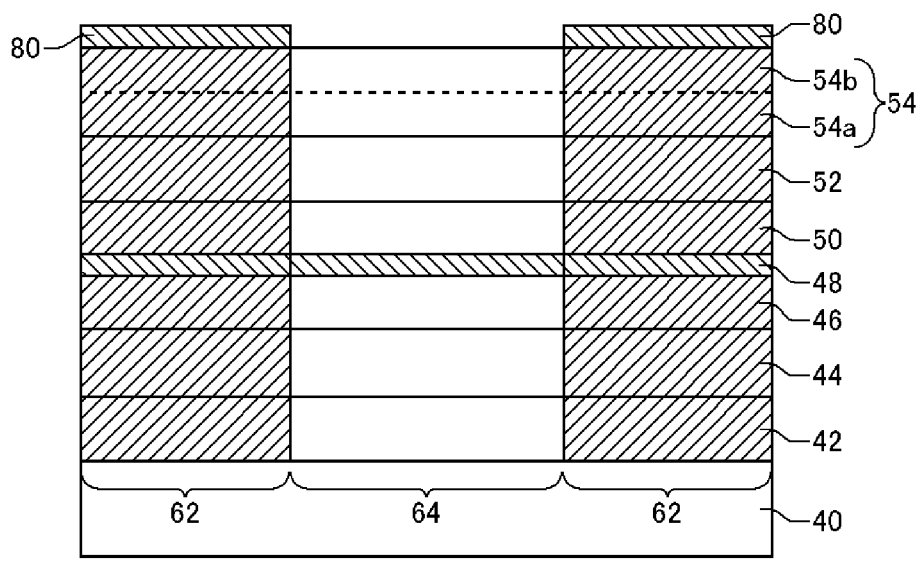
FIG. 14 shows a step performed after the step shown in FIG. 13.

FIG. 14 shows a step following the step shown in FIG. 13. As shown in FIG. 14, the first film 70 and the second film 72 are removed. Next, surface cleansing is performed on the surfaces of the current confinement layer 80 and the first contact layer 54. As a result of this surface cleansing, a decrease in the crystal quality at the regrowth interface can be prevented.

Figure 15:
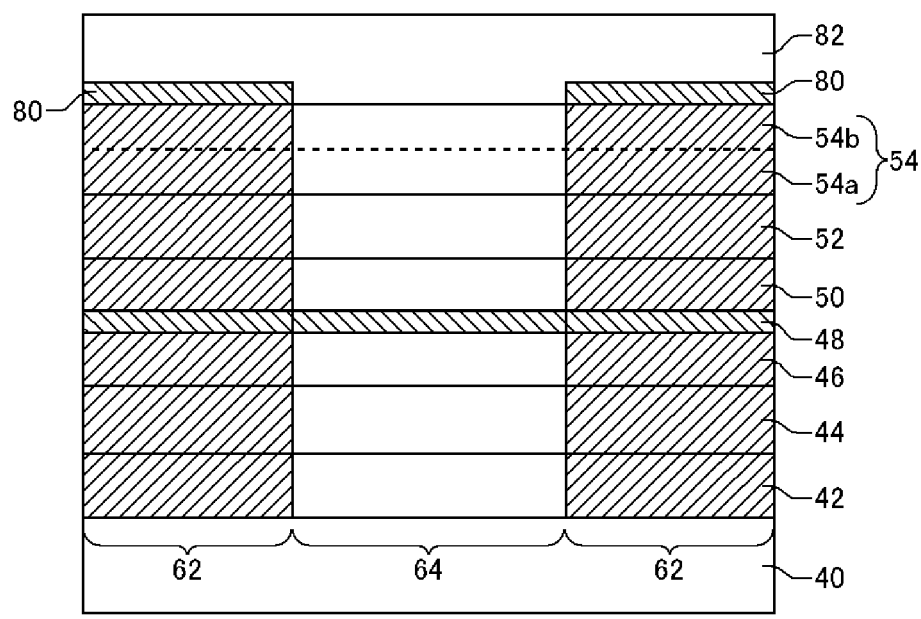
FIG. 15 shows a step performed after the step shown in FIG. 14.

FIG. 15 shows a step following the step shown in FIG. 14. As shown in FIG. 15, the p-type GaAs layer is regrown to form the second contact layer 82. The second contact layer 82 may be deposited using epitaxial growth at a high temperature and doped with a high concentration of Zn or Mg. The Zn doping concentration of the second contact layer 82 is 1E+19 (atoms/cm$^3$), for example. The Zn doping concentration of the first contact layer 54 is 1E+18 (atoms/cm$^3$), for example.

Finally, the upper electrode 58 is formed on the second contact layer 82, and the lower electrode 60 is formed on the bottom surface of the semiconductor substrate 40. The upper electrode 58 and the lower electrode 60 may be formed by sputtering.

Figure 16:
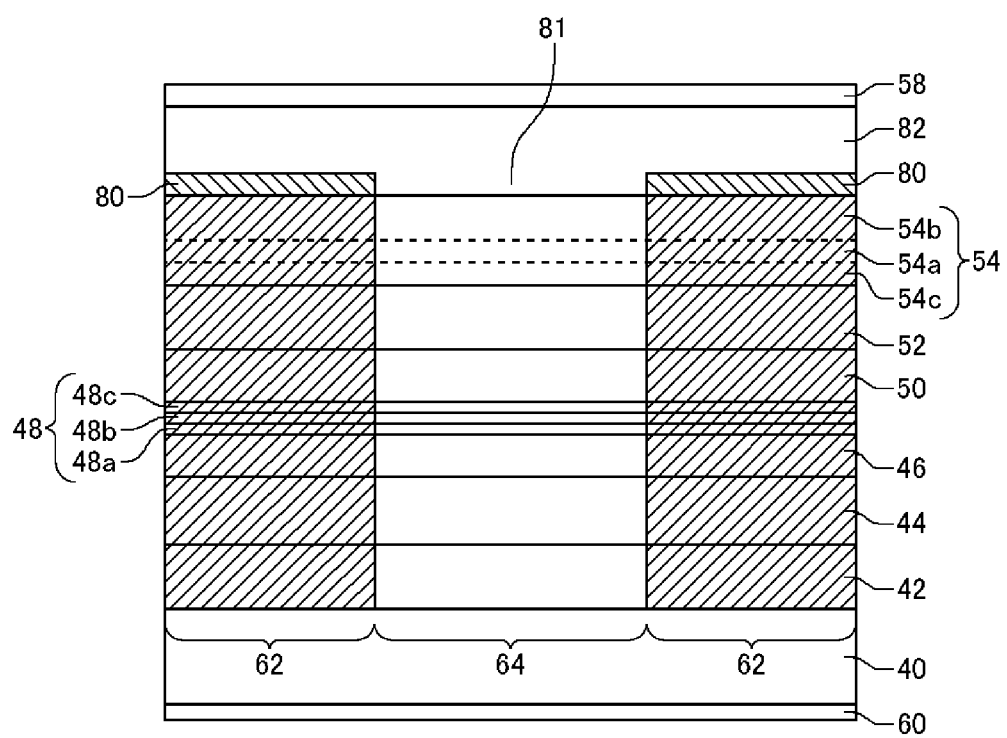
FIG. 16 is a cross-sectional view of a modification of the semiconductor laser element shown in FIG. 10.

FIG. 16 shows a semiconductor laser element 210 that is a modification of the semiconductor laser element 200. The first contact layer 54 semiconductor laser element 210 of the present modification differs from the first contact layer 54 of the semiconductor laser element 200. The first contact layer 54 of the semiconductor laser element 210 includes a third region 54c that has a lower p-doping amount than the first region 54b. The second region 54a is provided between the first region 54b and the third region 54c.

The step of depositing the first contact layer 54 in the present modification includes a step of depositing the third region 54c using epitaxial growth at a second temperature, prior to the step of depositing the second region 54a using epitaxial growth at a first temperature. The p-type doping amount of the third region 54c is lower than that of the first region 54b. The p-type dopant may be Zn, for example. The Zn doping amount in the first region 54b may be 1+E19 (atoms/cm$^3$) and the Zn doping amount in the third region 54c may be 1E+18 (atoms/cm$^3$). The first region 54b, the third region 54c, and the second region 54a are formed by a single epitaxial growth step.

Figure 17:
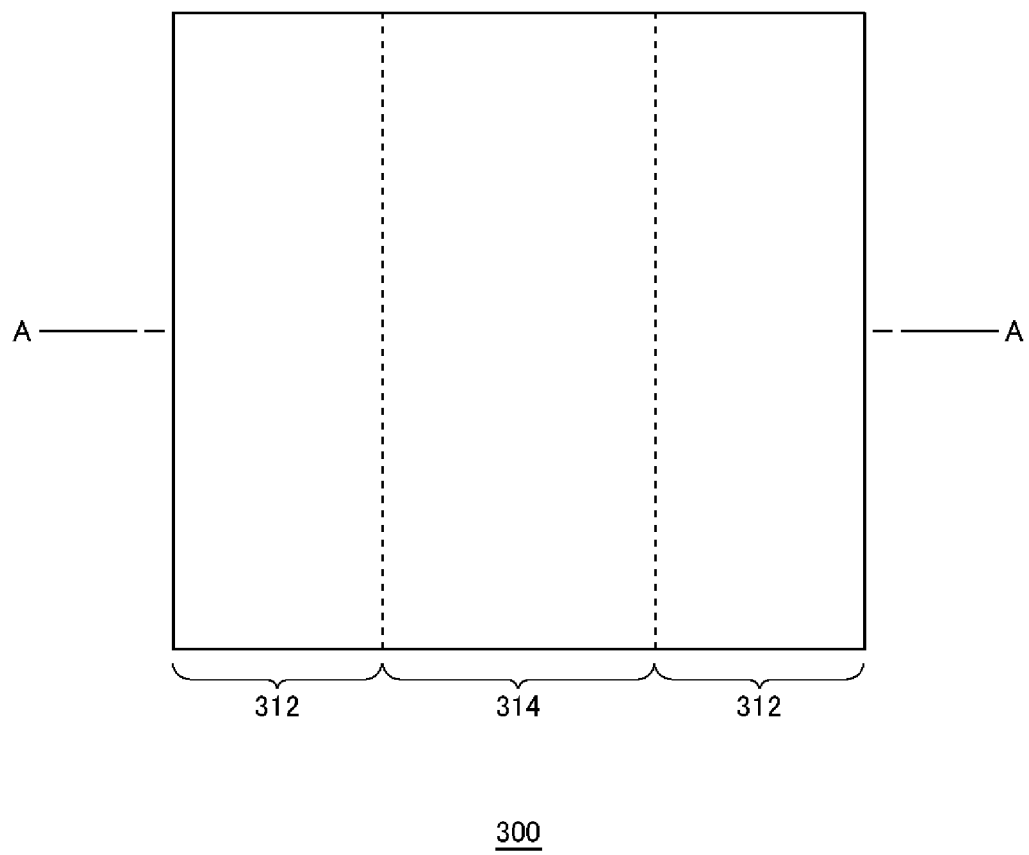
FIG. 17 is a planar view of an optical waveguide manufactured according to the manufacturing method of the third embodiment.
Figure 18:
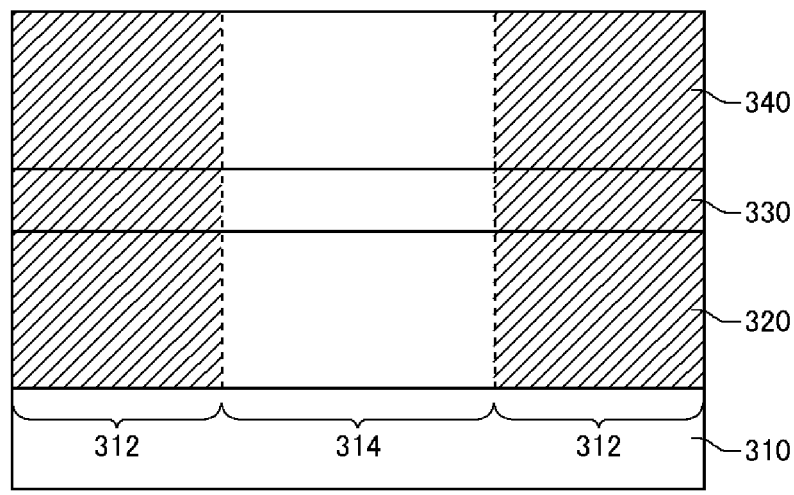
FIG. 18 is a cross-sectional view of the optical waveguide shown in FIG. 17 over the line A-A.

FIG. 17 is a planar view of an optical waveguide 300 manufactured according to the manufacturing method of a third embodiment of the present invention. FIG. 18 is a cross-sectional view over the line A-A of FIG. 17. The optical waveguide 300 includes a semiconductor substrate 310, and a semiconductor layer having a lower cladding layer 320, an optical waveguide layer 330, and an upper cladding layer 340 formed sequentially on the semiconductor substrate 310. The semiconductor layer of the optical waveguide 300 includes a first disordered region 312 that is selectively disordered in a direction perpendicular to the surface of the semiconductor substrate 310, and a second disordered region 314 that is formed to be sandwiched by the first disordered region 312.

The disordering of the second disordered region 314 is less than the disordering of the first disordered region 312. The disordering of the first disordered region 312 may be at least five times the disordering of the second disordered region 314. Specifically, the disordering of the first disordered region 312 is 25 meV or more, and the disordering of the second disordered region 314 is 5 meV or less. The bandgap energy of the first disordered region 312 is greater than the bandgap energy of the second disordered region 314. The refractive index of the first disordered region 312 is less than the refractive index of the second disordered region 314. In other words, the optical waveguide 300 includes the first disordered region 312 and the second disordered region 314 having different disordering, and therefore, the optical waveguide layer 330 has a difference in refractive index with respect to a direction parallel to the semiconductor substrate 310 and perpendicular to the propagation direction of the light.

Figure 19:
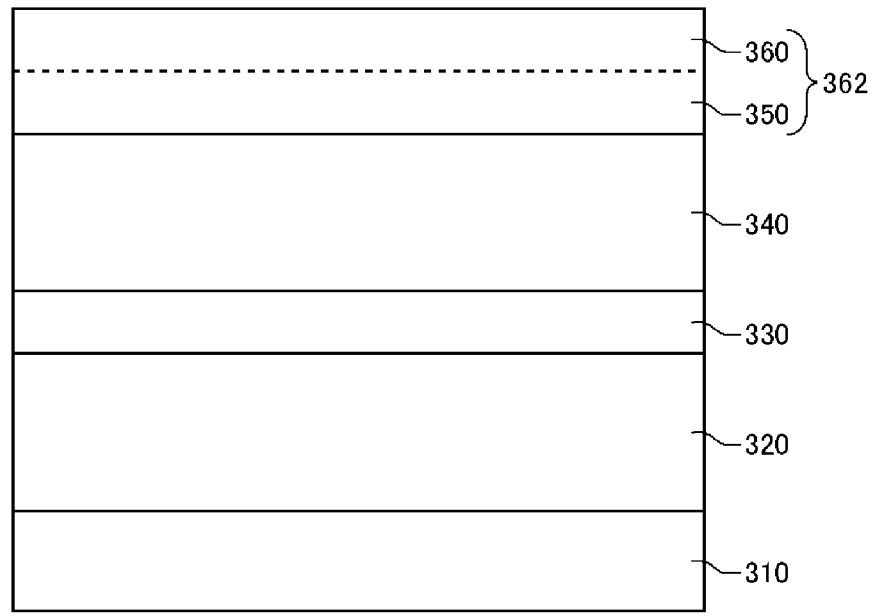
FIG. 19 shows a step for describing the method for manufacturing the optical waveguide according to the third embodiment.
Figure 20:
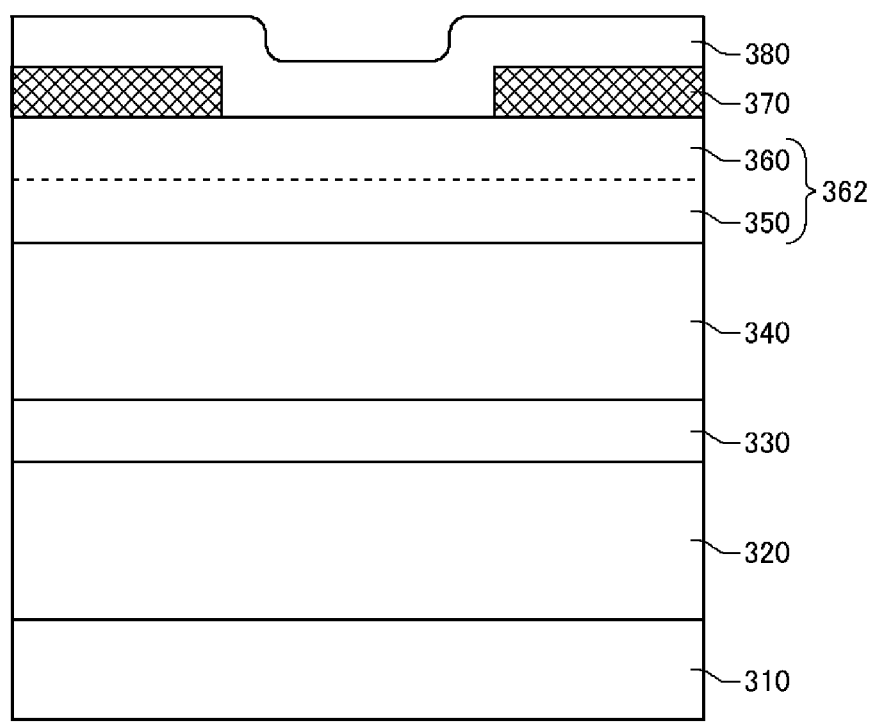
FIG. 20 shows a step performed after the step shown in FIG. 19.
Figure 21:
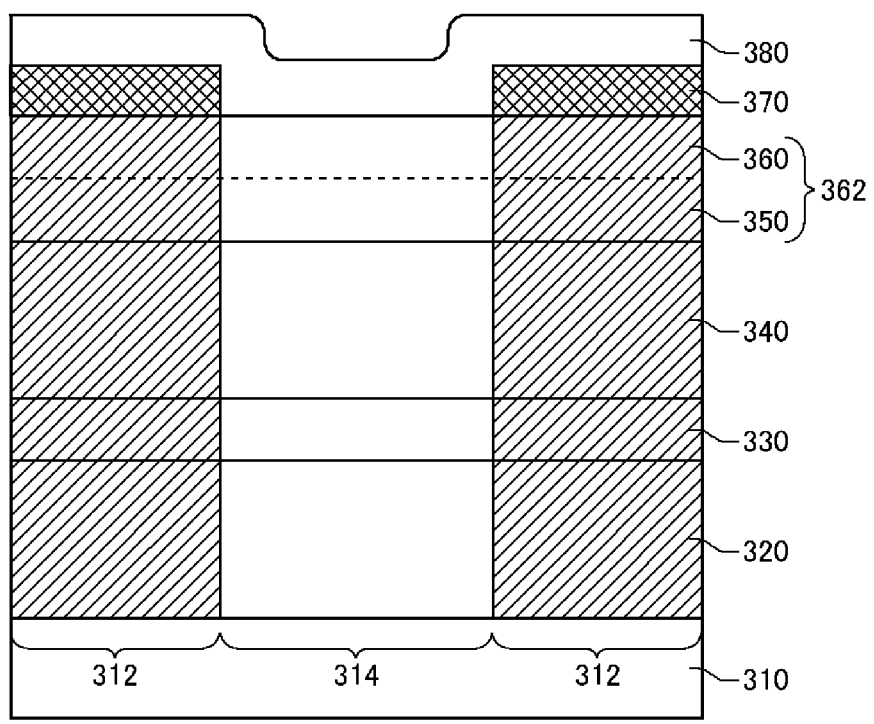
FIG. 21 shows a step performed after the step shown in FIG. 20.

FIGS. 19 to 21 show steps describing the optical waveguide 300 manufacturing process according to the third embodiment of the present invention. This manufacturing method includes a step of forming a semiconductor layer, a step of depositing two types of dielectric films (first film 370 and second film 380) with different densities on different regions of the semiconductor layer, and a step of forming the first disordered region 312 and the second disordered region 314 in the semiconductor layer through an annealing process.

FIG. 19 shows a step of forming the semiconductor layer. The semiconductor layer includes a vacancy generating region 360 that generates vacancies and a vacancy diffusion encouraging region 350 that encourages diffusion of the vacancies. The step of forming the semiconductor layer includes a step of preparing the semiconductor substrate 310, a step of sequentially depositing on the semiconductor substrate 310 a plurality of semiconductor layers including the lower cladding layer 320, the optical waveguide layer 330, and the upper cladding layer 340, and a step of depositing the vacancy generating and dispersing region 362 on the upper cladding layer 340. These layers are sequentially deposited using an epitaxial growth technique such as metal organic chemical vapor deposition (MOCVD) or molecular beam epitaxy (MBE).

The step of depositing the vacancy generating and dispersing region 362 includes a step of forming the vacancy diffusion encouraging region 350 and a step of forming the vacancy generating region 360. The vacancy diffusion encouraging region 350 has a greater affinity for hydrogen than the vacancy generating region 360. The step of forming the vacancy diffusion encouraging region 350 and the step of forming the vacancy generating region 360 are the same as the step of forming the second region 54a and the step of forming the first region 54b described in FIG. 3, and therefore a redundant description is omitted.

FIG. 20 shows a step of forming dielectric films. The step of forming the dielectric films includes a step of depositing two types of dielectric films (first film 370 and second film 380) with different densities on different regions of the vacancy generating region 360. The first film 370 is a non-dense film having a density that is less than the density of the second film 380. The second film 380 is a dense film having a density that is greater than the density of the first film 370. The step of forming the first film 370 and the second film 380 is the same as the step of depositing the two types of dielectric films (first film 70 and second film 72) with different densities on different regions of the contact layer 54 described in FIG. 4, and therefore a redundant description is omitted.

FIG. 21 shows the step of forming the first disordered region 312 and the second disordered region 314 through the annealing process. As a result of the annealing process, the vacancy generating region 360 generates vacancies with a density depending on the density of the corresponding dielectric films. The generated vacancies are dispersed in the semiconductor layer through the vacancy diffusion encouraging region 350. Among the two types of dielectric films (first film 370 and second film 380), the first disordered region 312 is formed by disordering the region of the semiconductor layer on which is deposited the dielectric film with the lower density (first film 370). The second disordered region 314 having a lower disordering than the first disordered region 312 is formed in the region of the semiconductor layer on which is deposited the dielectric film having higher density (second film 380).

In this step, the hydrogen concentration of the region corresponding to the second disordered region 314 of the vacancy diffusion encouraging region 350 is higher than the hydrogen concentration of the region corresponding to the first disordered region 312. The internal vacancies are generated by separation of the hydrogen in the vacancy diffusion encouraging region 350 corresponding to the first disordered region 312. The Ga of the vacancy generating region 360 corresponding to the first disordered region 312 is absorbed in the first film 370 through the annealing process, and group III vacancies are generated according to the density of the first film 370. The group III vacancies are encouraged to diffuse by the internal vacancies, and are dispersed in the optical waveguide layer 330 through the vacancy diffusion encouraging region 350.

As a result, among the two types of dielectric films, the first disordered region 312 is formed by disordering the lower cladding layer 320, the optical waveguide layer 330, and the upper cladding layer 340 corresponding to the region on which the first film 370 having the lower density is deposited. The second disordered region 314 having less disordering than the first disordered region 312 is formed on the lower cladding layer 320, the optical waveguide layer 330, and the upper cladding layer 340 corresponding to the region on which the second film 380 having higher density is deposited.

Figure 22:
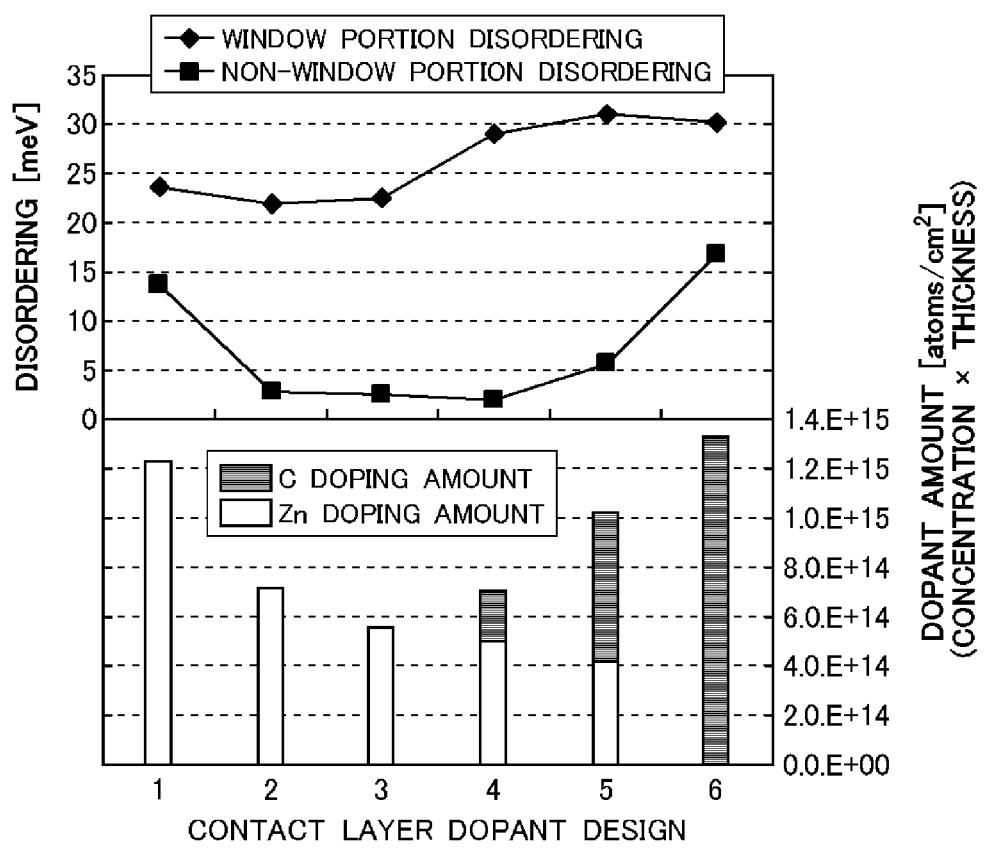
FIG. 22 is a graph showing a relationship between the design values of doping amounts in the contact layer and the disordering in the window portion and the non-window portion.

FIG. 22 is a graph showing a relationship between the design values of doping amounts in the contact layer 54 of the semiconductor laser element 100 and the disordering in the window portion 62 and the non-window portion 64. In the following description, the doping amount refers to an amount defined as the doping concentration (atoms/cm$^3$) multiplied by the layer thickness (cm). Furthermore, the disordering shows a change amount of the bandgap energy.

Designs 1 to 3 are examples using only Zn as the dopant. Designs 4 and 5 are exampled using C and Zn as the dopants. Design 6 is an example using only C as the dopant. With designs 1 to 3, when the doping amount is lower, the disordering of the non-window portion is lower and the ratio of the disordering of the window portion to the disordering of the non-window portion is higher. Accordingly, the results of designs 1 to 3 indicate that decreasing the total doping amount of the contact layer 54 is effective.

When a comparison is made between designs 2 and 4, even though the doping amount is the same, design 2 is doped with only Zn and design 4 is doped with both Zn and C. When a comparison is made between the disordering in designs 2 and 4, the disordering of the non-window portion is lower and the ratio of the disordering of the window portion to the disordering of the non-window portion is higher in the case of doping with both Zn and C than in the case of doping with only Zn. Accordingly, the results of designs 2 and 4 indicate that using Zn and C as the dopants is effective.

When a comparison is made between designs 4 and 5, the doping amount is greater and the C ratio is higher than the Zn ratio in design 5 than in design 4. When a comparison is made between the disordering of designs 4 and 5, the disordering of the non-window portion, which has the lower doping amount, is lower but the ratio of the disordering of the window portion to the disordering of the non-window portion is almost unchanged. Accordingly, the results of designs 4 and 5 indicate that it is effective to have a total doping amount of Zn and C that is no greater than 1.0E+15 (atoms/cm$^2$) and have a C doping amount that is less than the Zn doping amount.

When a comparison is made between designs 5 and 6, the doping amount is greater in design 6 than in design 5, and design 6 is doped only with C. When a comparison is made between the disordering of designs 5 and 6, the disordering of the non-window portion increases drastically when the doping amount increases, and the ratio of the disordering of the window portion to the disordering of the non-window portion decreases when only C is used for doping. Accordingly, the results of designs 5 and 6 indicate that it is effective to set the overall doping amount to be no greater than a prescribed value and to combine C and Zn as the dopants.

Figure 23:
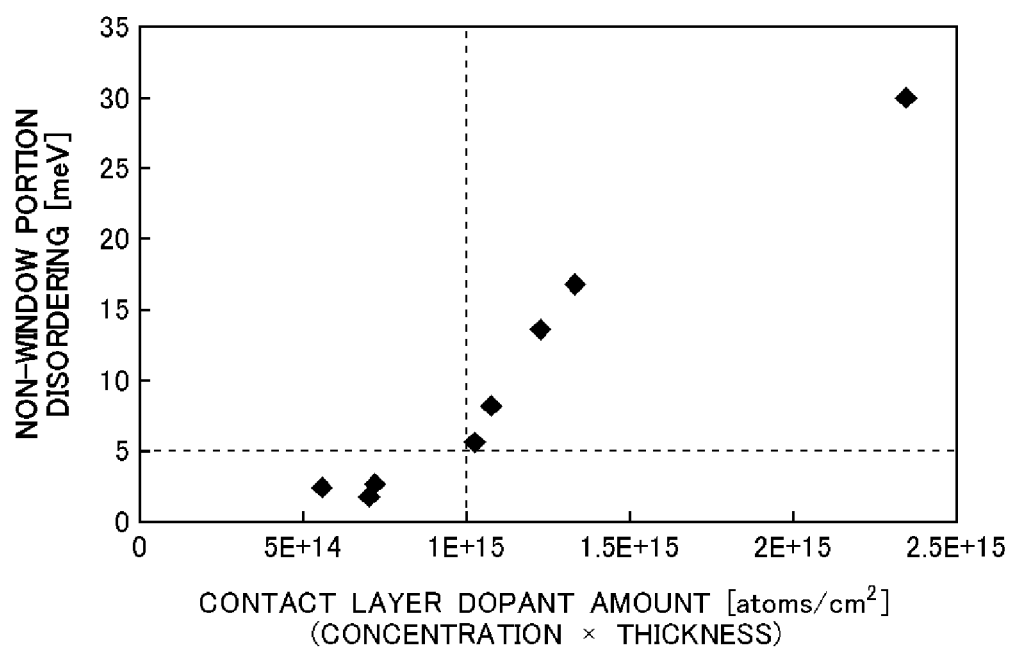
FIG. 23 is a graph showing the relationship between the total doping amount of the contact layer and the disordering of the non-window portion.

FIG. 23 is a graph showing the relationship between the total doping amount of the contact layer 54 and the disordering of the non-window portion in the semiconductor laser element 100. Based on this graph it is understood that the disordering of the non-window portion increases when the doping amount is increased. At a dopant concentration of 1E+15 (atoms/cm$^2$), which corresponds to design 5 in FIG. 17, the disordering of the non-window portion is a favorable value of approximately 5 meV.

Figure 24:
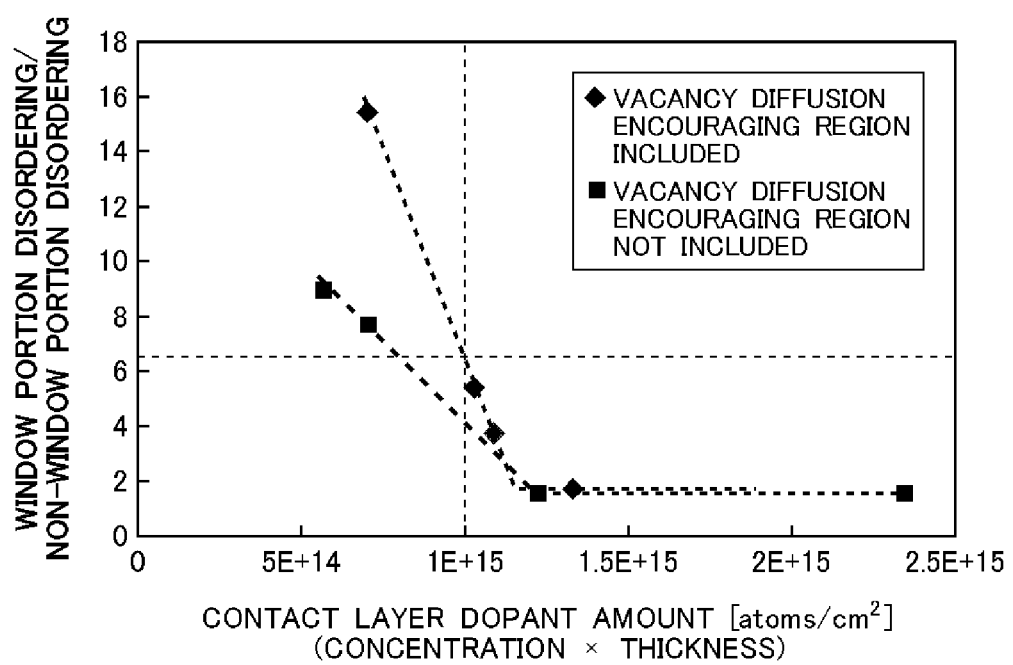
FIG. 24 is a graph showing the relationship between the total doping amount of the contact layer and the disordering of the window portion divided by the disordering of non-window portion, in a case where there is a second region and a case where there is no second region.

FIG. 24 is a graph showing the relationship between the total doping amount and the disordering of the window portion divided by the disordering of the non-window portion, in a case where the contact layer 54 of the semiconductor laser element 100 includes the second region 54a and a case where the contact layer 54 does not include the second region 54a. Based on this graph, when the doping amount is near a value of approximately 1.2E+15 (atoms/cm$^2$), the disordering of the window portion divided by the disordering of the non-window portion is approximately 2, regardless of whether the second region 54a is present. When the doping amount decreases below approximately 1.2E+15 (atoms/cm$^2$), the disordering of the window portion divided by the disordering of the non-window portion becomes greater than 2, and the disordering of the window portion divided by the disordering of the non-window portion is larger when the second region 54a is included than when the second region 54a is not included.

In other words, when the doping amount is less than approximately 1.2E+15 (atoms/cm$^2$) and the second region 54a is included, the non-window portion 64 can be formed with disordering that is less than ½ the disordering of the window portion 62. When the doping amount is 1E+15 (atoms/cm$^2$), which is the doping amount of design 5 in FIG. 17, the non-window portion 64 can be formed with disordering that is less than 1/7 the disordering of the window portion 62, and therefore this doping amount is favorable.

Figure 25:
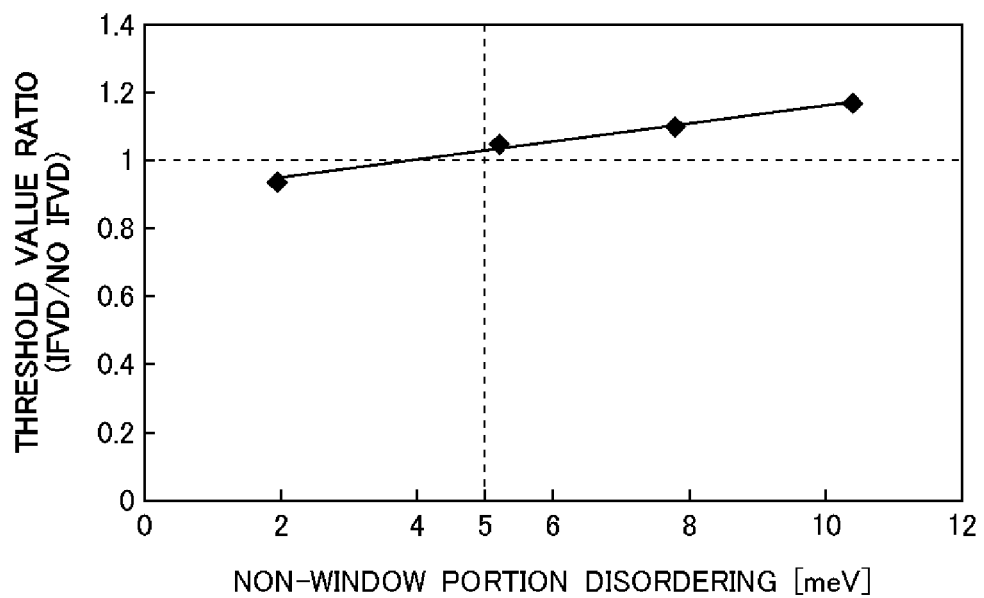
FIG. 25 shows the relationship between disordering of the non-window portion and a ratio of the threshold value in a case where IFVD is performed and a case where IFVD is not performed.

FIG. 25 shows the relationship between disordering of the non-window portion in the semiconductor laser element 100 and a ratio of the laser oscillation threshold voltage in a case where the window portion is formed by IFVD and a case where the window portion is not formed. When the threshold ratio is 1 or less, deterioration of the laser performance is restricted by the IFVD, and when the threshold ratio is greater than 1, the laser performance is deteriorated by the IFVD. Based on the graph, it is understood that the threshold value is approximately 1 when the disordering of the non-window portion is approximately 5 meV. As described above, the disordering of the non-window portion being approximately 5 meV corresponds to the case shown in FIG. 18 where the doping amount is 1E+15 (atoms/cm$^2$). The case in which the doping amount is 1E+15 (atoms/cm$^2$) corresponds to design 5 in FIG. 17. The doping amount may be set such that the disordering of the non-window portion is less than 4 meV.

Based on the experimental results shown in FIGS. 22 to 25, it is understood that the total doping amount of the contact layer 54 is preferably no greater than 1E+15 (atoms/cm$^2$). Furthermore, it is understood that the contact layer 54 preferably includes the second region and that the C doping amount is less than the Zn doping amount.

Figure 26:
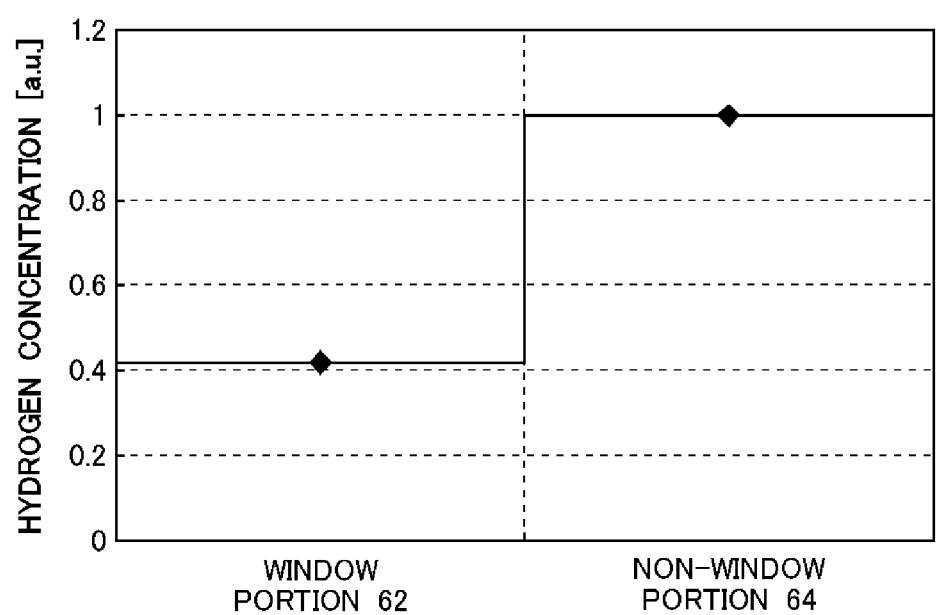
FIG. 26 is a graph showing the hydrogen concentration of the vacancy diffusion encouraging region corresponding to the non-window portion and of the vacancy diffusion encouraging region corresponding to the window portion.

FIG. 26 shows a comparison of the hydrogen concentration between the window portion 62 and the non-window portion 64 of the second region 54a. It is understood that the hydrogen concentration of the window portion 62 is approximately 40% of the hydrogen concentration of the non-window portion 64. Based on the graph, it is understood that, as a result of the RTA process, approximately 60% of the hydrogen of the second region 54a corresponding to the window portion 62 is absorbed in the first film 70, thereby generating internal vacancies.

Figure 27:
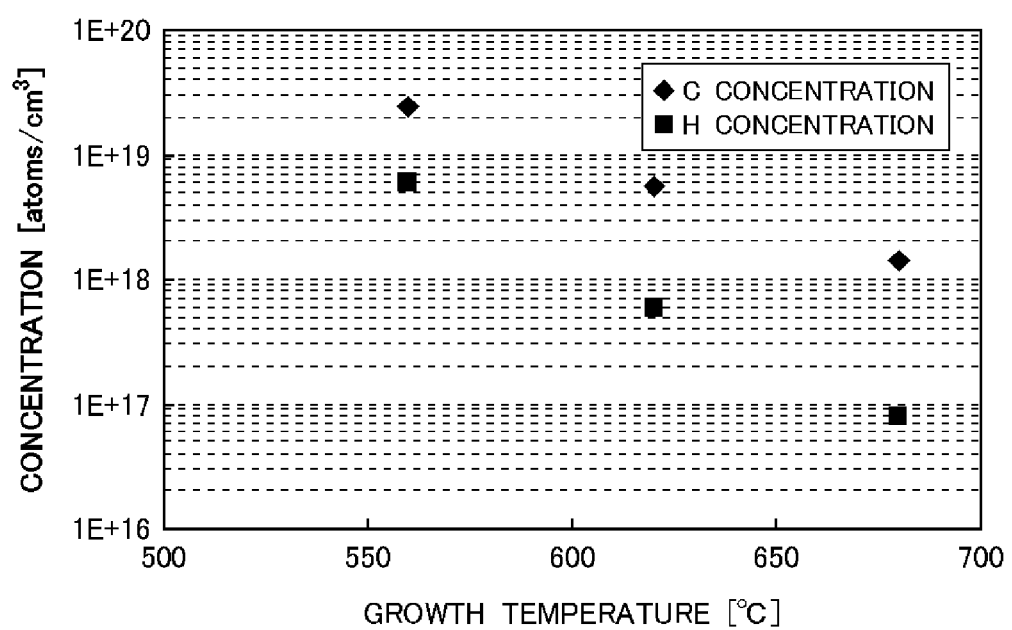
FIG. 27 shows the relationship between the epitaxial growth temperature of the vacancy diffusion encouraging region and the carbon concentration and hydrogen concentration in the deposited film.

FIG. 27 shows the relationship between the epitaxial growth temperature of the second region 54a, which is the vacancy diffusion encouraging region, and the C dopant concentration and hydrogen concentration. When the growth temperature is 680° C., the C doping amount is approximately 1.44E+18 (atoms/cm$^3$) and the H concentration is approximately 8.0E+16 (atoms/cm$^3$). When the growth temperature is 620° C., the C doping amount is approximately 5.68E+18 (atoms/cm$^3$) and the H concentration is approximately 5.8E+17 (atoms/cm$^3$). When the growth temperature is 560° C., the C doping amount is approximately 2.42E+19 (atoms/cm$^3$) and the H concentration is approximately 6.0E+18 (atoms/cm$^3$).

Based on these results, it is understood that the C is introduced in the film with a high affinity for H, when the temperature range is such that the C doping efficiency decreases relative to an increase in the growth temperature. Furthermore, it is understood that when the growth temperature is lower, the C doping concentration is higher and the hydrogen concentration introduced in the film increases. Specifically, it is preferable to form the second region 54a using epitaxial growth with a low temperature no greater than 680° C. and with a high C doping concentration of 1.5E+18 (atoms/cm$^3$).

Figure 28:
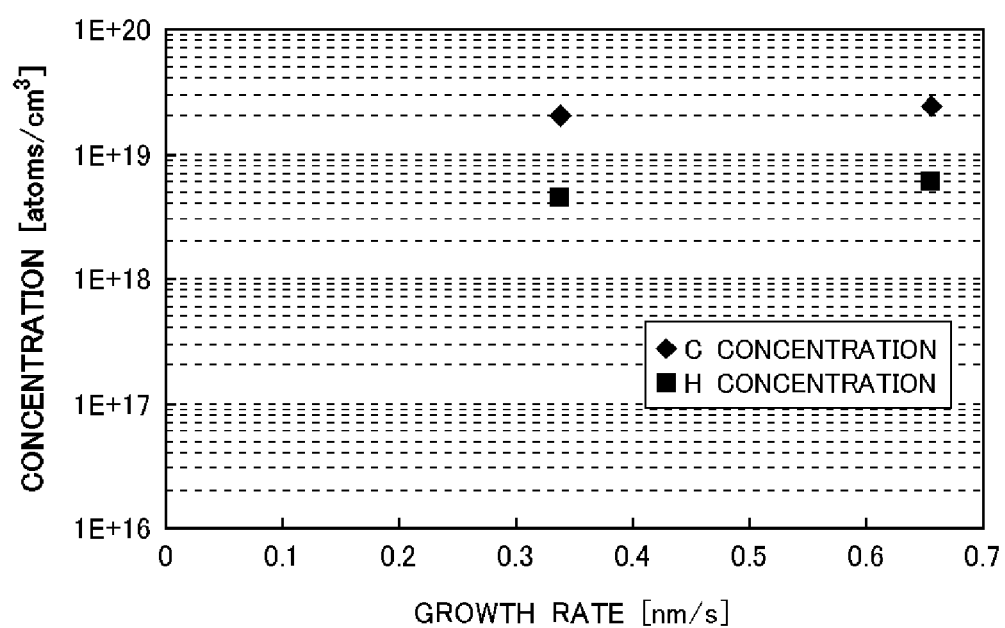
FIG. 28 shows the relationship between the growth rate for the epitaxial growth of the vacancy diffusion encouraging region and the C doping concentration and hydrogen concentration.

FIG. 28 shows the relationship between the growth rate for the epitaxial growth of the second region 54a, which is the vacancy diffusion encouraging region, and the C doping concentration and hydrogen concentration. The growth temperature was set to a constant 560° C. When the growth rate is approximately 0.34 nm/s, the C doping concentration is 2.05E+19 (atoms/cm$^3$) and the H concentration is 4.5E+18 (atoms/cm$^3$). When the growth rate is approximately 0.66 nm/s, the C doping concentration is 2.42E+19 (atoms/cm$^3$) and the H concentration is 6.0E+18 (atoms/cm$^3$). Based on these results, it is understood that the H concentration introduced in the film is increased by increasing the rate of the epitaxial growth of the second region 54a. The epitaxial growth rate of the first region 54b may be lower than the epitaxial growth rate of the second region 54a.

Figure 29:
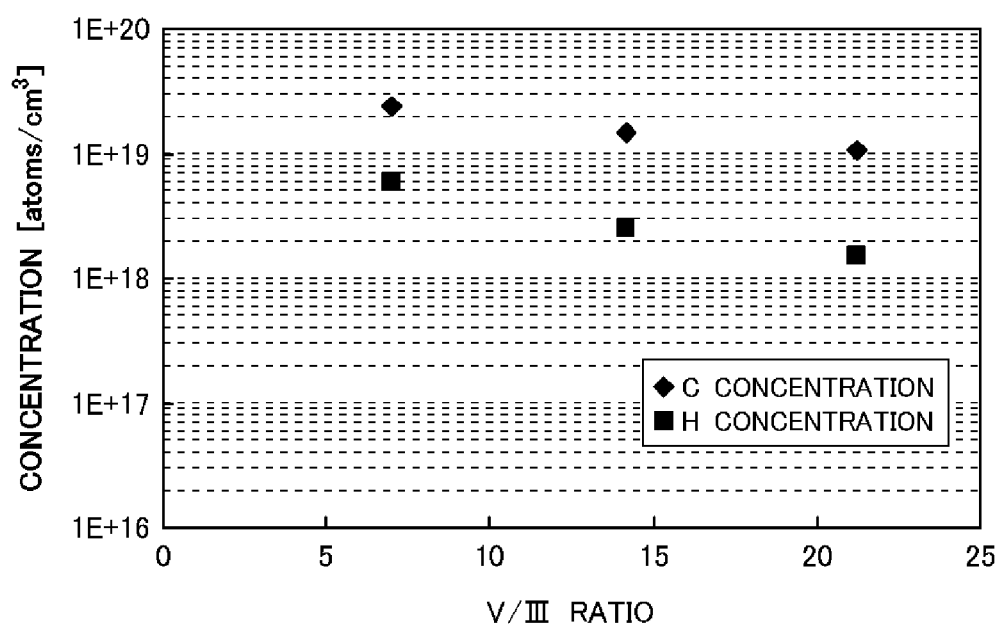
FIG. 29 shows the relationship between the flow rate ratio of the reactive gases during the epitaxial growth of the vacancy diffusion encouraging region, and the C doping concentration and hydrogen concentration.

FIG. 29 shows the relationship between the flow rate ratio of the reactive gases during the epitaxial growth of the second region 54a, which is the vacancy diffusion encouraging region, and the C doping concentration and hydrogen concentration. The flow rate ratio of the reactive gases refers to the ratio of the flow rate of arsine (AsH$_3$) gas, which is a group V atom supply gas, to the flow rate of trimethylgallium (TMG) gas, which is a group III atom supply gas. The growth temperature was set to a constant 560° C. When the flow rate ratio of the reactive gases is approximately 21.2, the C doping concentration is 1.06E+19 (atoms/cm$^3$) and the H concentration is 1.5E+18 (atoms/cm$^3$). When the flow rate ratio of the reactive gases is approximately 14.2, the C doping concentration is 1.49E+19 (atoms/cm$^3$) and the H concentration is 2.6E+18 (atoms/cm$^3$). When the flow rate ratio of the reactive gases is approximately 7.0, the C doping concentration is 2.42E+19 (atoms/cm$^3$) and the H concentration is 6.0E+18 (atoms/cm$^3$). Based on these results, it is understood that the H concentration introduced in the film is increased by decreasing the flow rate ratio of the reactive gases.

Figure 30:
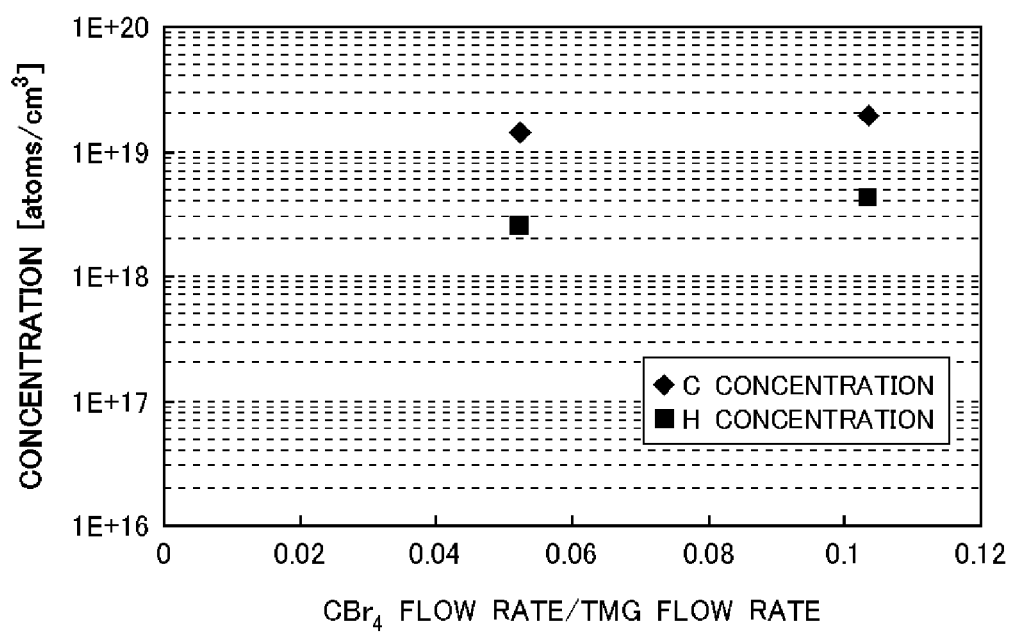
FIG. 30 shows the relationship between the dopant gas flow rate ratio during the epitaxial growth of the vacancy diffusion encouraging region, and the C doping concentration and hydrogen concentration.

FIG. 30 shows the relationship between the dopant gas flow rate ratio during the epitaxial growth of the second region 54a, which is the vacancy diffusion encouraging region, and the C doping concentration and hydrogen concentration. The dopant gas flow rate ratio refers to the ratio of the flow rate of carbon tetrabromide (CBr$_4$) gas, which is the C dopant gas, to the flow rate of trimethylgallium (TMG) gas, which is the group III atom supply gas. The growth temperature was set to a constant 560° C. The reactive gas flow rate ratio was kept constant. When the dopant gas flow rate ratio is approximately 0.052, the C doping concentration is 1.49E+19 (atoms/cm$^3$) and the H concentration is 2.6E+18 (atoms/cm$^3$). When the dopant gas flow rate ratio is approximately 0.103, the C doping concentration is 2.05E+19 (atoms/cm$^3$) and the H concentration is 4.5E+18 (atoms/cm$^3$). Based on these results, it is understood that the H concentration amount introduced in the film is increased by increasing the dopant gas flow rate ratio.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor light device, comprising:
a semiconductor substrate having a first conduction type;
a first cladding layer having the first conduction type and deposited above the semiconductor substrate;
an active layer deposited above the first cladding layer;
a second cladding layer having a second conduction type and deposited above the active layer; and
a contact layer deposited on the second cladding layer, wherein
the active layer includes
a window portion that is disordered via diffusion of vacancies, and
a non-window portion having less disordering than the window portion,
the contact layer includes
a first region, and
a second region that is below the first region and has greater affinity for hydrogen than the first region,
the second region has
a first hydrogen concentration in a region corresponding to the non-window portion, and
a second hydrogen concentration in a region corresponding to the window portion,
the first hydrogen concentration is higher than the second hydrogen concentration, and
the first hydrogen concentration in the region corresponding to the non-window portion is greater than $8.0E+16$ atoms/cm$^3$.

2. The semiconductor light device according to claim 1, wherein
the second region is formed at a lower growth temperature than a growth temperature for forming the first region.

3. The semiconductor light device according to claim 1, wherein
the first region includes a p-type GaAs layer doped with a first p-type dopant,
the second region includes a p-type GaAs layer doped with a second p-type dopant, and
the second p-type dopant has greater affinity for hydrogen than the first p-type dopant.

4. The semiconductor light device according to claim 3, wherein
the contact layer further includes a third region in which a doping amount of the first p-type dopant is less than a doping amount of the first p-type dopant in the first region, and
the second region is between the first region and the third region.

5. The semiconductor light device according to claim 3, wherein
the first p-type dopant includes Zn, Mg, or Be.

6. The semiconductor light device according to claim 3, wherein
the second p-type dopant includes carbon.

7. The semiconductor light device according to claim 3, wherein
the total doping amount of the first and second p-type dopants in the contact layer is no greater than $1.0E+15$ atoms/cm$^2$.

8. The semiconductor light device according to claim 3, wherein
a doping amount of the second p-type dopant in the second region is less than a doping amount of the first p-type dopant in the first region.

* * * * *